US009595546B2

(12) United States Patent
Kim et al.

(10) Patent No.: US 9,595,546 B2
(45) Date of Patent: Mar. 14, 2017

(54) DISPLAY BACKPLANE AND METHOD OF FABRICATING THE SAME

(71) Applicant: LG DISPLAY CO., LTD., Seoul (KR)

(72) Inventors: TaeHwan Kim, Goyang-si (KR); Namwook Cho, Paju-si (KR); Hyoung-Su Kim, Anyang-si (KR); Jaemyon Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/915,848

(22) PCT Filed: Feb. 25, 2015

(86) PCT No.: PCT/KR2015/001836
§ 371 (c)(1),
(2) Date: Mar. 1, 2016

(87) PCT Pub. No.: WO2015/130082
PCT Pub. Date: Sep. 3, 2015

(65) Prior Publication Data
US 2016/0240565 A1 Aug. 18, 2016

Related U.S. Application Data

(63) Continuation of application No. 14/231,586, filed on Mar. 31, 2014, now Pat. No. 9,490,276.
(Continued)

(30) Foreign Application Priority Data

Jul. 4, 2014 (KR) .................... 10-2014-0083731

(51) Int. Cl.
H01L 27/14 (2006.01)
H01L 27/12 (2006.01)
(Continued)

(52) U.S. Cl.
CPC ...... H01L 27/1251 (2013.01); H01L 27/0922 (2013.01); H01L 27/124 (2013.01);
(Continued)

(58) Field of Classification Search
CPC ............. H01L 27/1225; H01L 27/1251; H01L 27/3248
(Continued)

(56) References Cited

U.S. PATENT DOCUMENTS 8,134,152 B2* 3/2012 Choi .................. H01L 27/12
257/340
2006/0118869 A1 6/2006 Lan et al.
(Continued)

FOREIGN PATENT DOCUMENTS

KR 10-2010-0081836 A 7/2010
KR 10-2011-0060479 A 6/2011
KR 10-2012-0065048 A 6/2012

*Primary Examiner* — Tan N Tran
(74) *Attorney, Agent, or Firm* — Dentons US LLP

(57) ABSTRACT

An organic light emitting display is provided. The organic light emitting display comprises a multi-type thin-film transistor (TFT) and an organic light emitting diode. The multi-type TFT has a low-temperature-poly-silicon (LTPS) TFT and an oxide semiconductor TFT (oxide TFT) disposed on the LTPS TFT. The organic light emitting diode is electrically connected to the multi-type TFT. The LTPS TFT and the oxide TFT are connected to the same gate line.

9 Claims, 22 Drawing Sheets

Related U.S. Application Data

(60) Provisional application No. 61/944,499, filed on Feb. 25, 2014, provisional application No. 61/944,464, filed on Feb. 25, 2014.

(51) Int. Cl.
| | | |
|---|---|---|
| *H01L 29/786* | (2006.01) | |
| *H01L 27/092* | (2006.01) | |
| *H01L 27/32* | (2006.01) | |

(52) U.S. Cl.
CPC ...... *H01L 27/1222* (2013.01); *H01L 27/1225* (2013.01); *H01L 27/1255* (2013.01); *H01L 29/7869* (2013.01); *H01L 29/78606* (2013.01); *H01L 29/78672* (2013.01); *H01L 29/78696* (2013.01); *G09G 2300/0408* (2013.01); *G09G 2300/0465* (2013.01); *G09G 2300/0819* (2013.01); *G09G 2300/0852* (2013.01); *G09G 2300/0861* (2013.01); *G09G 2310/0251* (2013.01); *H01L 27/3262* (2013.01)

(58) Field of Classification Search
USPC .......... 257/59, 72, 40, 43; 345/215
See application file for complete search history.

(56) References Cited

U.S. PATENT DOCUMENTS

| | | |
|---|---|---|
| 2011/0127520 A1 | 6/2011 | You |
| 2012/0146713 A1 | 6/2012 | Kim et al. |
| 2013/0264564 A1 | 10/2013 | Park et al. |
| 2014/0299842 A1* | 10/2014 | Kim ................. H01L 29/78678 257/40 |
| 2015/0243722 A1* | 8/2015 | Kwon ................. H01L 27/3262 257/40 |

* cited by examiner

① Initial
② Sampling & Program
③ Emission

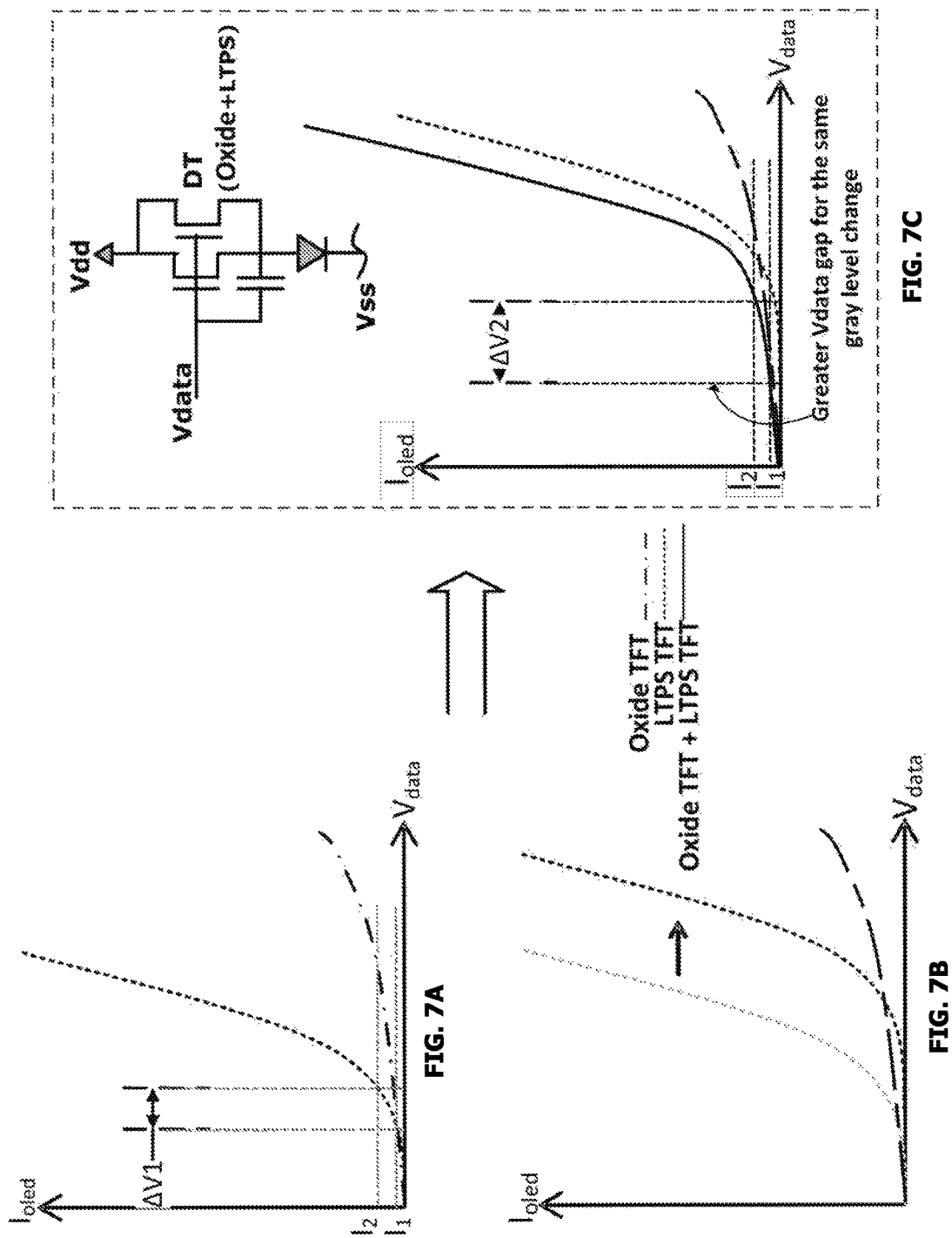

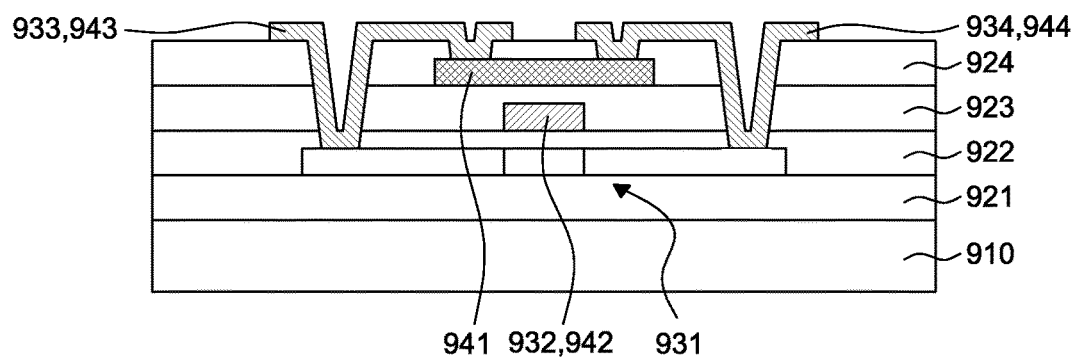
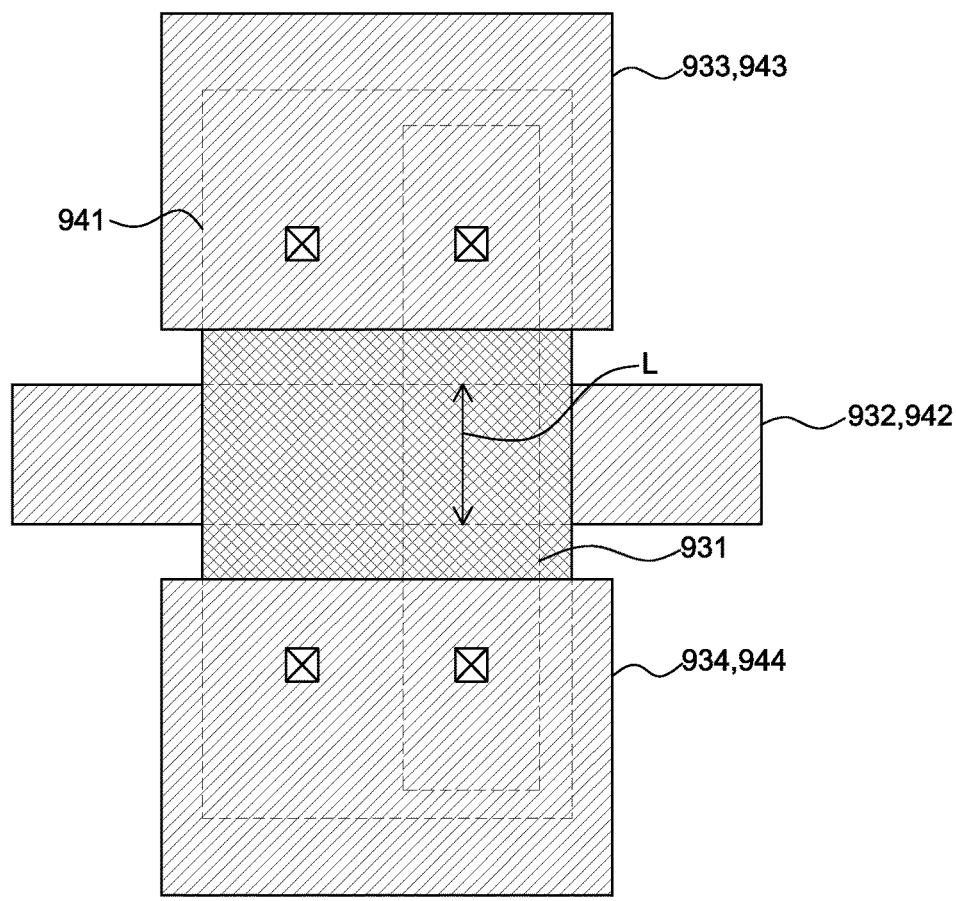
FIG. 9

DISPLAY BACKPLANE AND METHOD OF FABRICATING THE SAME

This application is the National Phase Entry of PCT/KR2015/001836 filed on Feb. 25, 2015 and claims the benefit of U.S. Provisional Application Nos. 61/944,499 and 61/944,464 both filed Feb. 25, 2014 and U.S. application Ser. No. 14/231,586 filed Mar. 31, 2014 and Korean Patent Application No. 10-2014-0083731 filed Jul. 4, 2014 in the Korean Intellectual Property Office, the disclosures of which are herein incorporated by reference in their entirety for all purposes.

BACKGROUND

Technical Field

The present disclosure relates to a thin-film-transistor (TFT) backplane for a display device, and more particularly, to a TFT backplane for more power efficient operation of the display and a method of fabricating such a TFT backplane.

Description of the Related Art

Flat panel displays (FPDs) are employed in various electronic devices such as mobile phones, tablets, notebook computers as well as televisions and monitors. Examples of the FPD includes a liquid crystal display (LCD), a plasma display panel (PDP), an organic light emitting diode (OLED) display as well as an electrophoretic display (EPD).

Generally, pixels in a FPD are arranged in a matrix form, and generate light (luminescence) upon electrical activation from an array of thin-film-transistors (TFTs), also known as TFT backplane. A TFT backplane plays an important role in a FPD as it functions as a series of switches to control the current flowing to each individual pixel. TFT backplanes that have been developed until recently can be categorized into two primary types, one using TFTs with amorphous silicon (a-Si) active layer and the other using TFTs with polycrystalline silicon (poly-Si) active layer.

A TFT with a-Si active layer generally has lower carrier mobility ($\mu$) than that of a TFT with poly-Si active layer. Thus, making a high speed drive circuit (e.g., pixel circuit, gate drive integrated circuit, data drive integrated circuit) for a display is difficult with the TFT backplane employing a-Si TFTs.

In case of heat-treating a layer of amorphous silicon by using a laser beam, the layer of amorphous silicon can become a polycrystalline silicon active layer. The material according to this process is generally referred to as low-temperature polycrystalline silicon (LIPS). In general, the carrier mobility ($\mu$) of LIPS TFTs is higher than the a-Si TFTs by as much as 100 times (>100 $cm^2/V \cdot s$). Despite significantly high carrier mobility of LIPS TFT, there is a downside as LIPS TFTs of a backplane has variations in their threshold voltages (Vth) due to a grain boundary. Such non-uniform threshold voltages among the TFTs employed in a TFT backplane may result in display non-uniformity referred to as the "mura." For this reason, a display drive circuit implemented with LIPS TFTs often requires a complex compensation circuit, which in turn, occurs a problem as it increases the manufacturing time and cost of the display.

For flexible displays, a-Si TFTs or LIPS TFTs of the backplane need to be formed at low temperature to prevent thin plastic or glass substrates from degrading. However, because lowering the temperature during the fabrication process degrades the performance of the TFTs, there was a limitation in applying the above TFTs to flexible displays.

Due to the above problems of the silicon based TFTs, other type of backplane technology, which employees TFTs having an active layer formed of a metal oxide material has been suggested. In particular, oxide TFTs are regarded as an alternative to silicon based TFTs because of their high mobility (>10 $cm^2/V \cdot s$) and low process temperature (<250° C.), compared to those of a-Si TFTs. The lower leakage current and the scalability to any glass size make the oxide TFT a promising candidate for making a high performance TFT backplane for displays at low cost.

Stable and high-yield production of a TFT backplane employing oxide TFTs requires optimization of the TFT design, dielectric and passivation materials, oxide film deposition uniformity, annealing conditions, and more. Also, manufacturing process variations need to be minimized in order to tightly control the operating characteristics of such TFTs, including their threshold voltages. For example, adopting the etch-stopper type oxide TFTs can improve the reliability, but such a design suffers from high parasitic capacitance and complicates the manufacturing process. Further, the etch-stopper type limits how short the TFT channel can be, thereby affecting the overall size of the display backplane or the aperture ratio in the pixels of the display. As such, there are difficulties for designing the driving circuitry for a display.

SUMMARY

In view of the problems above, inventors of the embodiments in the present disclosure recognized that there is a limit in a conventional TFT backplane employing only one kind TFTs as its constituent TFTs. In recent years, as FPDs have been widely applied to devices requiring versatile pixel driving methods, there is a need for providing a TFT backplane that combines advantages of various types of TFTs such as oxide TFTs and LIPS TFTs. In particular, when various types of TFTs on a substrate are applied to a TFT backplane, a display with high resolution and low power consumption can be provided.

In order to solve the problems above, an organic light emitting display device according to an embodiment of the present disclosure comprises a multi-type thin-film transistor (TFT) having a low-temperature-poly-silicon (LIPS) TFT and an oxide semiconductor TFT (oxide TFT) disposed on the LIPS TFT; and an organic light emitting diode electrically connected to the multi-type TFT, wherein the LIPS TFT and the oxide TFT are connected to the same gate line.

According to another aspect of the present disclosure, a gate electrode of the LIPS TFT may be configured to work as a gate electrode of the oxide TFT.

According to still another aspect of the present disclosure, a source electrode of the LIPS TFT may be configured to work as a source electrode of the oxide TFT, and a drain electrode of the LIPS TFT may be configured to work as a drain electrode of the oxide TFT.

According to still another aspect of the present disclosure, the gate electrode of the LIPS TFT may be disposed on an active layer of the LIPS TFT, an active layer of the oxide TFT may be disposed on the gate electrode of the LIPS TFT, and the source electrode and the drain electrode of the LIPS TFT may be in contact with the active layer of the LIPS TFT and the active layer of the oxide TFT.

According to still another aspect of the present disclosure, an active layer of the LIPS TFT may overlap with an active layer of the oxide TFT.

According to still another aspect of the present disclosure, the LIPS TFT and the oxide TFT may be disposed such that a channel region of the oxide TFT and a channel region of the LIPS TFT overlap each other.

According to still another aspect of the present disclosure, an area of a region where the active layer and a gate electrode of the oxide TFT overlap each other may be different from an area of a region where the active layer and a gate electrode of the LIPS TFT overlap each other, and a length of a region where the active layer and the gate electrode of the oxide TFT overlap each other may be different from a length of a region where the active layer and the gate electrode of the LIPS TFT overlap each other.

According to still another aspect of the present disclosure, the oxide TFT may be an n-type TFT, and the LIPS TFT may be a p-type TFT.

According to still another aspect of the present disclosure, the multi-type TFT may be configured to operate as a driving TFT.

According to still another aspect of the present disclosure, a gate electrode of the LIPS TFT may be configured to shield at least channel region of an active layer of the oxide TFT.

According to still another aspect of the present disclosure, the organic light emitting display may further comprise a hydrogen blocking layer disposed under an active layer of the oxide TFT in order to block hydrogen.

It should be noted that the embodiments described in the present disclosure are not intended to be bound or otherwise be limited by any express or implied theory presented in the preceding background and brief summary. It should also be appreciated that the following detailed description is merely exemplary in nature and is not intended to limit the embodiments or the application and uses thereof. Hereinafter, exemplary embodiments will be described in detail with reference to the accompanying drawings.

BRIEF DESCRIPTION OF THE DRAWINGS

FIGS. 7A, 7B and 7C are schematic circuit diagrams of an exemplary pixel circuit, and a set of graphs showing the characteristic of the pixel circuit.

FIG. 9 is a schematic illustration of an exemplary thin-film-transistor structure.

DETAILED DESCRIPTION OF THE PREFERRED EMBODIMENT

Figure 1:
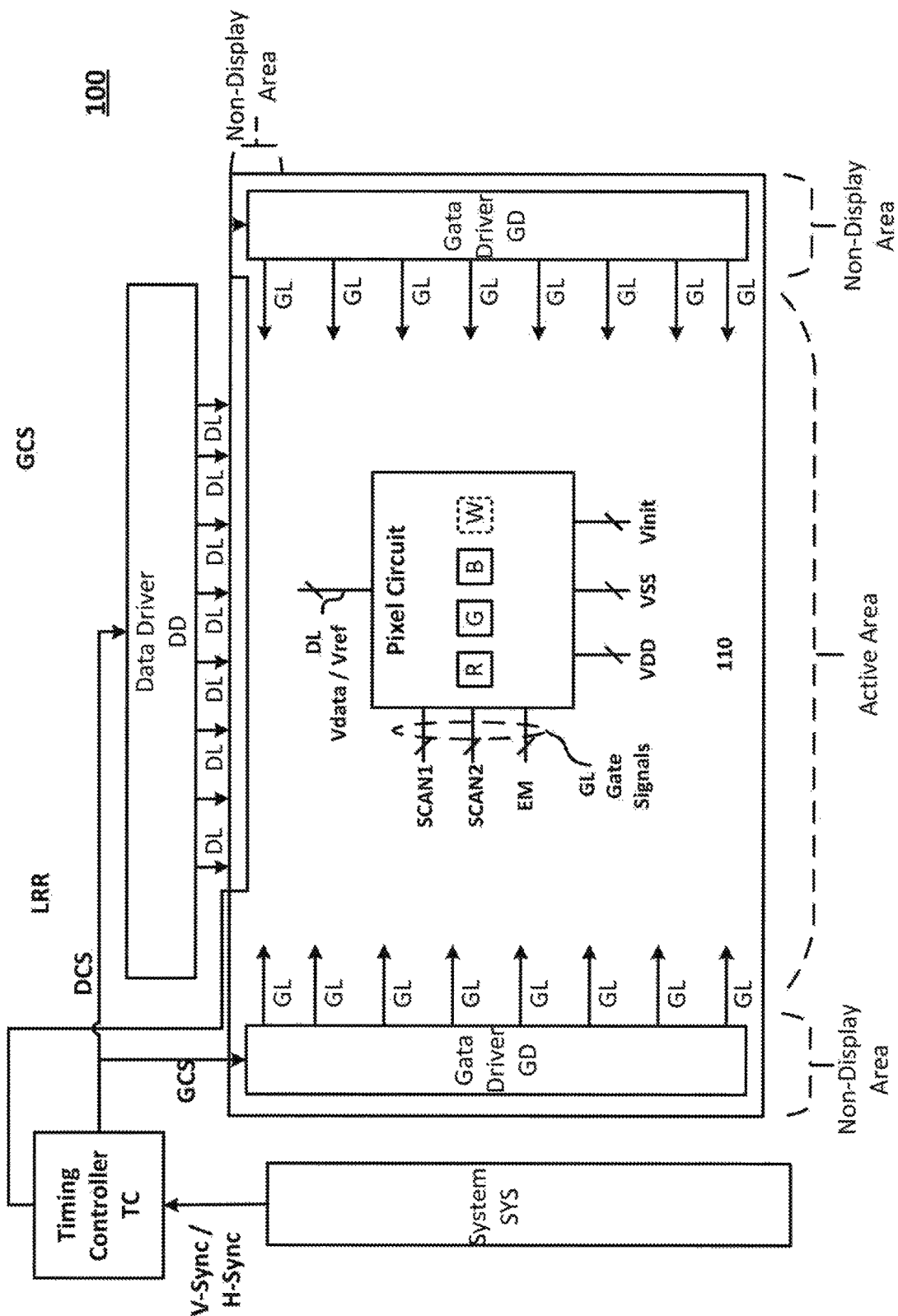
FIG. 1 is a schematic diagram illustrating a display having an active area and a non-display area.

Various features and advantages described in the present disclosure will be more clearly understood from the following description with reference to the accompanying drawings. The accompanying drawings are merely illustrative and may not be drawn to scale for easier explanation. Also, components having the same or similar function may be denoted by the same reference symbols or numeral throughout the drawings for describing various embodiments. The descriptions of the same or similar components may be omitted.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Further, it will be understood that when an element is referred to as being "overlapped" with another element, at least some portion of one element can be positioned above or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

Respective features of various exemplary embodiments of the present disclosure can be partially or totally joined or combined with each other and as sufficiently appreciated by those skilled in the art, various interworking or driving can be technologically achieved and the respective exemplary embodiments may be executed independently from each other or together executed through an association relationship. Hereinafter, various embodiments of the present disclosure will be described in detail with reference to the accompanying drawings.

Exemplary Display

While clever configuration of pixel circuits and driving methods may solve for some of the drawbacks, but it may not satisfy continuously increasing requirements by the modern display.

A poly-crystalized silicon active layer of LIPS TFT offers greater carrier mobility than that of an oxide TFT. The higher mobility means that the TFT can be fabricated smaller for the same performance. Fabrication process of LTPS TFT is well suited for co-planar structured TFT, which provides lower unwanted capacitance than the etch-stop structure typically used in oxide TFT. However, a TFT backplane made entirely of LTPS TFT suffers increased power consumption due to the high off current of the LTPS TFT and may also exhibit display quality issues due to the initial threshold voltage variation among the TFTs of the backplane. On the other hand, the oxide TFT has advantages as it has more reliable initial threshold voltage than that of LTPS TFT and it can increase the size of the TFT backplane. Not only does oxide TFT have lower off current that makes more power efficient TFT backplane in a normal operation of the display, it enables low refresh rate driving of the circuits for even greater power savings of the display. Simpler and lower cost fabrication process coupled with the scalability for larger area over a TFT backplane makes the oxide TFT a better choice than the LIPS TFT for part of a TFT backplane.

In the present disclosure, the semiconductor of the oxide TFT may be made from various metal oxides. Examples of a constituent material of the oxide semiconductor layer includes a quaternary metal oxide such as an indium-tin-gallium-zinc-oxide (In—Sn—Ga—Zn—O)-based material, a ternary metal oxide such as an indium-gallium-zinc-oxide (In—Ga—Zn—O)-based material, an indium-tin-zinc-oxide (In—Sn—Zn—O)-based material, an indium-aluminum-zinc-oxide (In—Al—Zn—O)-based material, an indium-hafnium-zinc-oxide (In—Hf—Zn—O)-based material, a tin-gallium-zinc-oxide (Sn—Ga—Zn—O)-based material, an aluminum-gallium-zinc-oxide (Al—Ga—Zn—O-based material) and a tin-aluminum-zinc-oxide (Sn—Al—Zn—O)-based material, and a binary metal oxide such as an indium-zinc-oxide (In—Zn—O)-based material, a tin-aluminum-zinc-oxide (Sn—Zn—O)-based material, an aluminum-zinc-oxide (Al—Zn—O)-based material, a zinc-magnesium-oxide (Zn—Mg—O)-based material, a tin-magnesium-oxide (Sn—Mg—O)-based material, an indium-magnesium-oxide (In—Mg—O)-based material, an indium-gallium-oxide (In—Ga—O)-based material, an indium-oxide (In—O)-based material, a tin-oxide (Sn—O)-based material and a zinc-oxide (Zn—O)-based material. Composition ratios of the elements included in the respective oxide semiconductor materials are not particularly limited, and may be adjusted at various composition ratios.

In various embodiments of the present disclosure, TFT backplanes for displays are implemented with at least two different types of TFTs. That is, at least two different types of TFTs are formed on a single substrate to implement circuitry for operating a display. For example, one or more of driving circuits in the non-display area of the TFT substrate can be implemented with a specific type of TFTs (e.g., LTPS TFTs) while the pixel circuit in the active area (i.e., display area) of the TFT substrate is implemented with another type of TFTs (e.g., oxide TFT). Also, the pixel circuit in the active area and/or any other circuit fabricated in the non-display area of the TFT substrate may be implemented with at least two different types of TFTs. For example, at least one TFT (e.g., driving TFT) included in a pixel circuit can be the first type of TFT (e.g., LTPS TFT) while at least one other TFT (e.g., switching TFT) included in the pixel circuit is formed of the second type of TFT (e.g., oxide TFT). It should be appreciated that circuit fabricated in the non-display area of the TFT substrate may also include at least two different types of TFTs. The type of TFTs employed in the part of the pixel circuit and the part of the circuit in the non-display area can vary according to the requirements of the display 100.

Exemplary Thin-Film-Transistor Backplane

FIG. 1 illustrates an exemplary flat panel display (FPD) 100 according to an embodiment of the present disclosure. The display 100 may be implemented with a self-emitting organic light-emitting diode (OLED) or a liquid crystal (LC) material. While the embodiments of the present disclosures are described in reference to an OLED display, it should be appreciated that the embodiments of the present disclosure are also applicable to LCD display.

The display 100 can be defined in an active area (i.e., display area) and a non-active area (i.e., non-display area). In the display area, a plurality of display pixels is arranged in a matrix. Each of the display pixels is associated with a pixel circuit implemented with one or more capacitors and thin-film-transistors (TFTs) that are configured to receive various signals form the driving circuits. The TFTs for implementing the pixel circuits may be formed on various types of substrates, such as a glass substrate, a plastic substrate, or other suitable substrate, which may be referred to a TFT substrate or TFT backplane 110.

In operating the display 100, various circuits and components may operate together to provide signals and/or voltages to the pixel circuits in the display area. The circuits and components that may be needed in operating the display 100 are not limited and include a system (SYS), a timing controller (TC), a data driver (DD), a gate driver (GD), and the like. Circuits and components necessary in operating the display may vary depending on the type of the display 100 (e.g., OLED, LCD, etc.).

Some of these components may be integrated into a package. For instance, the timing controller TC and the data driver DD, may be integrated into a single package, which may be collectively referred to as a display driver integrated circuit (display D-IC). The display D-IC may be mounted to an interface (not shown) in the non-display area of the TFT substrate 110 using the chip-on-glass (COG) technology, via tape-carrier-package (TCP) or Chip-on-Film (COF) technology.

The display D-IC may include various other circuits serving different functionalities in operating the display 100. For example, the display D-IC may include storage circuits such as volatile and non-volatile memory circuits, solid state drives, hard drives, and other memory and storage circuitry. The display D-IC may also include processor such as processing circuitry in a microprocessor or other processor. Examples of integrated circuits that may be included in display driver-IC include microprocessors, digital signal processors, power management units, baseband processors, microcontrollers, application-specific integrated circuits, circuits for handling audio and/or visual information, and other control circuitry.

Some driving circuits may be formed on a separate substrate and connected to the TFT substrate 110 to transmit signals to the display pixels. In the embodiments of the present disclosure, at least one of the various driving circuits for providing a signal and/or voltage to the pixel circuits is implemented with one or more TFTs formed in the non-active area (i.e., non-display area) of the TFT substrate 110. In way of example, one or more gate driver GD can be formed in the non-display area of the TFT substrate 110 using the gate-in-panel (GIP) technology as shown in FIG. 1. The number of gate driver GD on the TFT substrate 110 is not particularly limited. For instance, one or more gate drivers may be disposed in the non-display area of the TFT substrate 110.

While the data driver DD can be integrated in the display D-IC mounted to the TFT by using COG, TCP or COF, in some embodiments, the data driver DD or at least part of the data driver DD can be implemented with TFTs fabricated in the non-display area of the TFT backplane 110 in the similar fashion (i.e., GIP technology) as the gate driver GD. For instance, the data driver DD may include one or more of source drive IC, buffers and multiplexers, which may be implemented directly on the TFT backplane 110.

As such, it should be appreciated that circuits, which can be fabricated with TFTs in the non-display area of the TFT substrate 110, is not particularly limited. Any circuits for operating the display 100 can be fabricated in the non-display area of the TFT substrate 110 so long as they can be implemented by with TFTs on the TFT substrate 110. Depending on the type of the display 100 and its driving method, additional circuits, such as an emission driver ED, inverter, multiplexer, de-multiplexer and the like, may be used in operating the display 100, and they may be implemented with the TFTs fabricated in the non-display area of the TFT substrate 110.

System

The system SYS may be configured to provide vertical synchronization signal, horizontal synchronization signal, clock signal, and image data through a transmitter of a graphic controller to appropriate circuits. For instance, the vertical/horizontal synchronization signal and clock signal from the system SYS are provided to the timing controller TC. The image data from the system SYS is also provided to the timing controller TC.

Timing Controller

The timing controller TC receives the horizontal synchronization signal, the vertical synchronization signal, a data enable signal, a clock signal, and image data from an interface circuit (not shown). The vertical synchronization signal indicates time required to display an image of one frame. The horizontal synchronization signal indicates time required to display one horizontal line of an image, that is, one pixel line. Thus, the horizontal synchronization signal includes pulses equal in number to the number of pixels included in one pixel line. The data enable signal indicates a period in which valid image data are positioned.

The timing controller provides a gate control signal GCS to the gate driver GD and a data control signal DCS to the data driver DD.

The gate control signal GCS applied to the gate driver GD may include a gate start pulse signal GSP, a gate shift clock signal GSC, a gate output enable signal GOE, and so on. The gate start pulse signal GSP is a signal for control of timing of a first gate signal of the gate driver GD, the gate shift clock signal GSC is a signal for sequentially shifting and outputting the gate start pulse signal GSP, and the gate output enable signal GOE is a signal for control of output timing of the gate driver GD.

The timing controller TC rearranges image data such that image data having a predetermined bit, which is provided from the interface, may be provided to the data driver DD. For example, the timing controller TC may supply data driver DD with digital data corresponding to text, graphics, video, or other images to be displayed on display 100. The data driver DD may convert the data that is received from the timing controller TC into signals for controlling the display pixels.

A data control signal DCS provided to the data driver DD may include a source sampling clock signal SSC, a source output enable signal SOE, a source start pulse signal SSP, and so on. The source sampling clock signal SSC is used as a sampling clock for latching image data by the data driver DD and to determine a driving frequency of the data driver DD. The source output enable signal SOE is used to transmit the image data latched by the source sampling clock signal SSC to appropriate pixels. The source start pulse signal SSP is a signal indicating beginning of latch or sampling of the image data for one horizontal period. When the display is an LCD display, the data control signal DCS may also include a polarity reverse signal for reversing the polarity of the data voltage Vdata from the data driver DD.

In addition, the timing controller TC may be used in running various software for operating the display 100. For example, the timing controller may be configured to execute code in connection with the displaying of images on display 100 (e.g., text, pictures, video, etc.), the timing controller TC may be configured to run testing software (e.g., code that is used during manufacturing to support interactions between display 100 and test equipment), timing controller TC may be configured to can run code that allows the timing controller TC to adjust operating settings (e.g., to store calibration data or other settings in controller in the control circuitry such as non-volatile storage), etc.

As will be described in greater detail below, the timing controller TC can also be configured to adjust the frame rate of at least some part of the display area 100. In this regard, the timing controller TC can provide a low refresh rate signal LRR to a switching circuit coupled to the data driver DD and/or gate driver GD, so that the frequency of signals (e.g., scan signal, emission signal, data signal) provided to pixel circuits in the display area can be adjusted.

In some embodiments, the output of the LRR signal may be controlled by the system SYS. The system SYS may be configured to analyze the image data and control the state of the LRR signal to the appropriate driving circuits. In some cases, the image data provided to the system SYS may include various data that can be used by the system SYS in generating the LRR signal. Non-limiting examples of the information that may be provided to the system SYS includes information indicative of the type of image data, information indicative of dimension and location of the image content to be applied with an adjusted frame rate, and information indicative of appropriate frame rate.

The output of the low refresh rate signal LRR from the timing controller TC may be triggered by various other ways. For instance, if the display 100 is used in a device that provides a specific mode in which the image content can be displayed at a low frame rate (e.g., mode for displaying time on a screen, mode for displaying static user interface, etc.), the low refresh rate signal LRR can be set to high upon the device entering into such a mode. Likewise, exiting from such a low frame rate mode can set the low refresh rate signal LRR back to low. Triggering of the low frame rate mode can be controlled by software implemented in the system SYS or the timing controller TC. It can also be triggered by a user command delivered via a touch interface and/or a physical button.

Data Driver

As mentioned, the data driver DD receives digital image data from the timing controller TC. The data driver DD may be configured to convert the digital image data into gamma correction voltages to generate data voltages Vdata, in response to data control signal DCS from the timing controller TC. And then, the data driver DD may supply the data voltages Vdata to the data lines DL of the display 100 in synchronization with the gate control signal GCS from the gate driver GD. As will be described in greater detail below, in some embodiments, the data driver DD may be configured to output data voltages Vdata in a limited frequency rate in response to the low refresh rate signal LRR from the timing controller TC.

Gate Driver

The gate driver GD controls on/off of TFTs in pixels in response to the gate control signal GCS input from the timing controller TC and allows data voltages Vdata applied from the data driver DD to be applied to the appropriate pixel circuit. To this end, the gate driver GD sequentially outputs gate signals (e.g., Scan signals, emission signals) and sequentially applies the gate signals to the gate lines GL. When the gate signals are provided on a gate line GL, the data voltages Vdata may be applied to the sub-pixels R, G, and B (or W, R, G and B) of pixel circuits connected with that particular gate line GL. As will be described in further detail below, in some embodiments, the gate driver DD may be configured to pause sending out gate signals on certain gate lines in response to receiving the low refresh rate signal LRR from the timing controller TC.

Pixels

The data lines DL and gate lines GL of the exemplary display 100 may cross each other in the active area, and each pixel circuits may be formed at the crossing of a data line DL and a gate line GL. The pixels may be formed of liquid crystal display (LCD) components, organic light-emitting diode (OLED) components or other suitable display pixel structures. As such, the configuration of TFTs and capacitors implementing the pixel circuit may vary depending on the type of the display component as well as the driving methods for activating the pixel.

Each of the pixels may include red sub-pixel R for displaying red color, green sub-pixel G for displaying green color, and blue sub-pixel B for displaying blue color. It should be noted that the arrangement of the sub-pixels in the active area is not particularly limited. Further, in some embodiments, at least some of the pixels in the display 100 may employ white pixel or white sub-pixel as shown in FIG. 1.

Assuming the display 100 in FIG. 1 is an OLED display, each pixel of the display 100 may include at least one switching TFT, a driving TFT, an organic light emitting diode, and at least one capacitor. Each pixel can be connected to the data line DL and the gate line GL through the switching TFTs such that each pixel receives a data voltage Vdata from the data driver DD through the data line DL and a gate signals from the gate driver GD through the gate line GL. In some embodiments, the display 100 may include an emission driver ED (which may be a part of the gate driver GD), which provides an emission signal EM to each of the pixels. Each pixel emits light according to the current flowing to the organic light emitting diode, which is controlled by the switching TFT and the driving TFT. The display 100 can be implemented as a bottom emission structure, a top emission structure or dual emission (i.e., top and bottom) structure.

Uniform driving of OLED pixels is not easy. The difficulty in uniform driving of the OLED pixels in the display largely attributes to (1) current-dependent luminance of the OLED, (2) large TFT dimensions with high gate-to-drain capacitance (Cgd) and gate-to-source capacitance (Cgs), and (3) threshold voltage and mobility variations of the TFTs in the pixel circuit. Also, the size and the carrier mobility of a TFT is generally proportional, but the number of TFTs and their sizes are limited by the size of the pixel area. Accordingly, mobility of the TFTs can be limited by the space available for the pixel circuit and/or driving circuits on the TFT backplane. Solving these problems can be extremely difficult with a TFT backplane using only single type of TFTs.

LTPS TFT based Driving Circuits and Oxide TFT based Pixel Circuit

Figure 2:
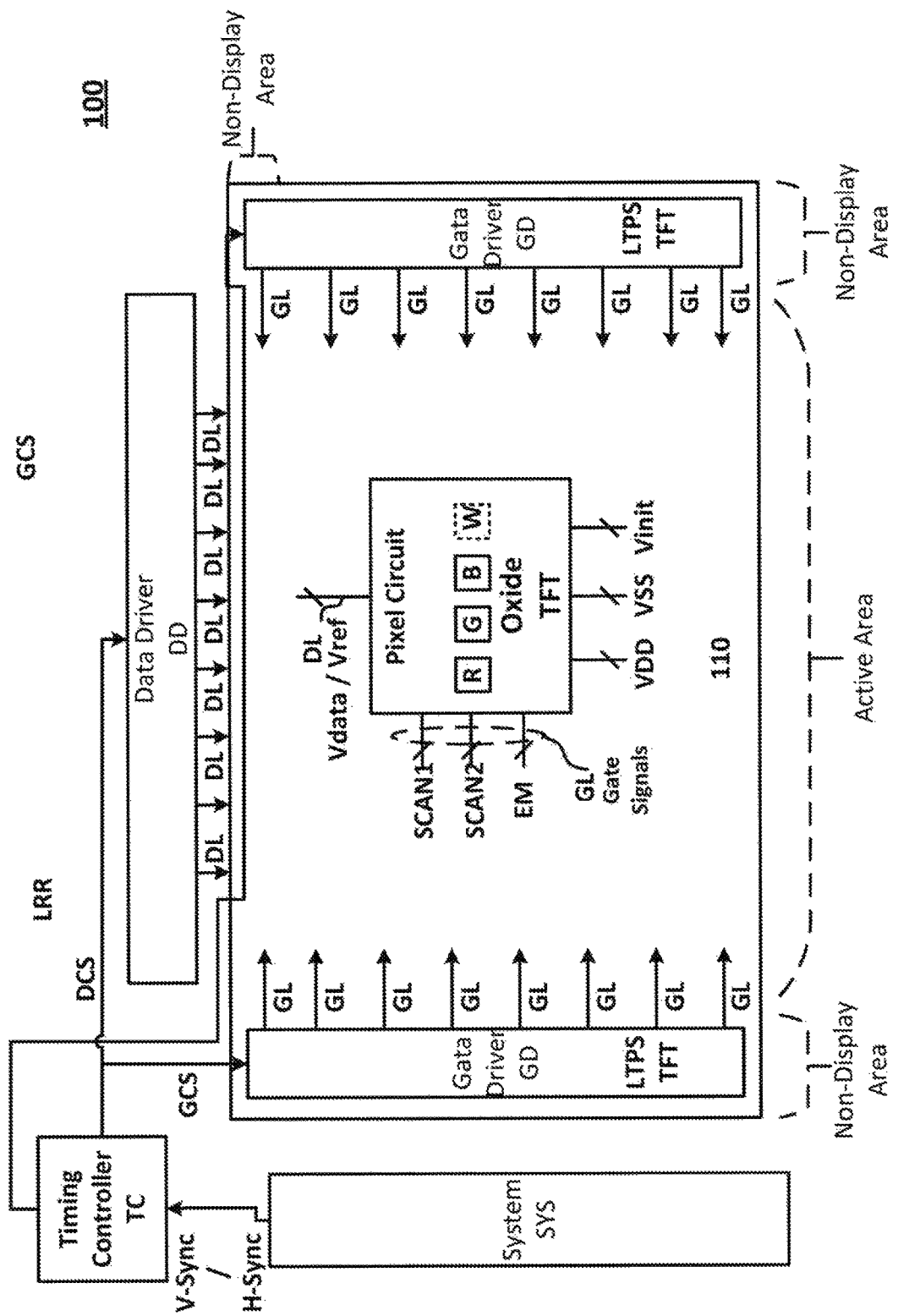
FIG. 2 is a schematic diagram illustrating a display having pixel circuits in an active area, which are formed of oxide TFTs and driving circuits in a non-display area, which are formed of LIPS TFTs.

FIG. 2 is a schematic illustration of an exemplary display employing two different types of TFTs on the same TFT backplane 110 according to an embodiment. In this example, the pixel circuits are implemented with oxide TFTs while the driving circuits formed in the non-display area (i.e., gate driver GD) are implemented with LIPS TFT. As mentioned, other driving circuits, such as buffers, (de)multiplexers, source driver, switching circuits, can be implemented with LIPS TFTs in the non-display area of the TFT backplane 110.

Accordingly, the advantages of both oxide TFT and LIPS TFT may be combined in the design of the TFT backplane. As discussed above, initial Vth and mobility variations of the LIPS TFT occur due to grain size and boundary variations. In contrast, the initial Vth of oxide TFTs can be substantially uniform within a TFT backplane 110. Accordingly, uniform Vth for the driving TFT and/or the switching TFT can be obtained by implementing the pixel circuits with oxide TFTs. As such, pixel circuits implemented with oxide TFTs would suffer significantly less from the pixel-to-pixel threshold voltage variation issue exhibited in the LIPS TFT based backplane, even in a large sized TFT backplane.

With the gate driver GD implemented with LIPS TFTs, signals to the pixel circuits can be provided at a higher clock rate than the case in which the driving circuits implemented with oxide TFTs. The area of the TFT backplane reserved for the driving circuits may be small enough to obtain sufficiently uniform threshold voltages among the LIPS TFTs of the driving circuits.

Efficient use of the space within the TFT substrate is yet another advantage offered by the TFT backplane 110 using the oxide TFT implemented pixel circuits and the LIPS TFT implemented driving circuits. Although the size of individual oxide TFT may be larger than the size of an LIPS TFT, uniform threshold voltage of the oxide TFTs in the active area eliminates the need for a complex compensation circuit, which is often required in LIPS TFT implemented pixel circuits.

Because such compensation circuit can be eliminated, the design of the pixel circuits can be simplified and the size of the pixels can be reduced. In addition, the size of the capacitor that needs to be formed in each of the pixels can be reduced due to the low currant leakage characteristic of the oxide TFT. The reduction of TFT counts and the size of the capacitor can reduce the overall size of the pixel circuit. Accordingly, because higher-resolution display can be provided within a limited space, this can be usefully utilized for modern displays such as ultra-high definition displays.

Because the complexity and the size of the capacitors are reduced, the size of light transmissive area within a pixel, which can be crucial for transparent displays, can be increased. Since the reduction of the TFT counts and the size of the capacitor means less external light reflecting parts within a pixel, display quality can be improved due to such TFT backplane design.

Non-display area of a TFT backplane 110 is often covered under a masking (e.g., bezel) around the display 100. It may be desirable to minimize the non-display area of the TFT backplane 110. The size of the non-display area may be minimized by minimizing circuit complexity (e.g., transistor count) in gate driver GD. As briefly mentioned above, the mobility ($\mu$) of LIPS TFTs is higher than that of oxide TFTs by several folds. As such, an LIPS TFT outperforms an oxide TFT even when it is fabricated several folds smaller than the oxide TFT. As a consequence, relatively smaller size of LIPS TFT provides condensed driving circuit in the non-display areas of the TFT backplane 110, thereby reducing the portion of the display 100 that needs to be covered by a bezel. In addition, because LIPS TFT has low on-resistance, more power-efficient operation than the case in which the entire TFT backplane is formed of oxide TFTs can be possible.

In fabricating an LIPS TFT, hydrogenation of the poly-silicon semiconductor layer may be performed. However, oxide semiconductor layer, for example, an In—Ga—Zn-Oxide semiconductor layer, may be negatively affected by hydrogen. The changes in TFT characteristics after the formation of the TFT backplane may lead to various problems. Nevertheless, the TFT backplane design of the embodiment separates the area of the TFT substrate with LIPS TFTs and the area with oxide TFTs, thereby eliminating the needs for heavy barrier layer and simplifying the fabrication of both types of TFTs on the same substrate.

Oxide TFT and LTPS TFT in a Pixel Circuit

In one embodiment, more elaborate optimization of a display is achieved by implementing a pixel circuit with various types of TFTs. That is, the type of individual TFT within a pixel circuit is carefully chosen based on its functionality, operating condition and various other requirements within the pixel circuit.

Figure 3A:
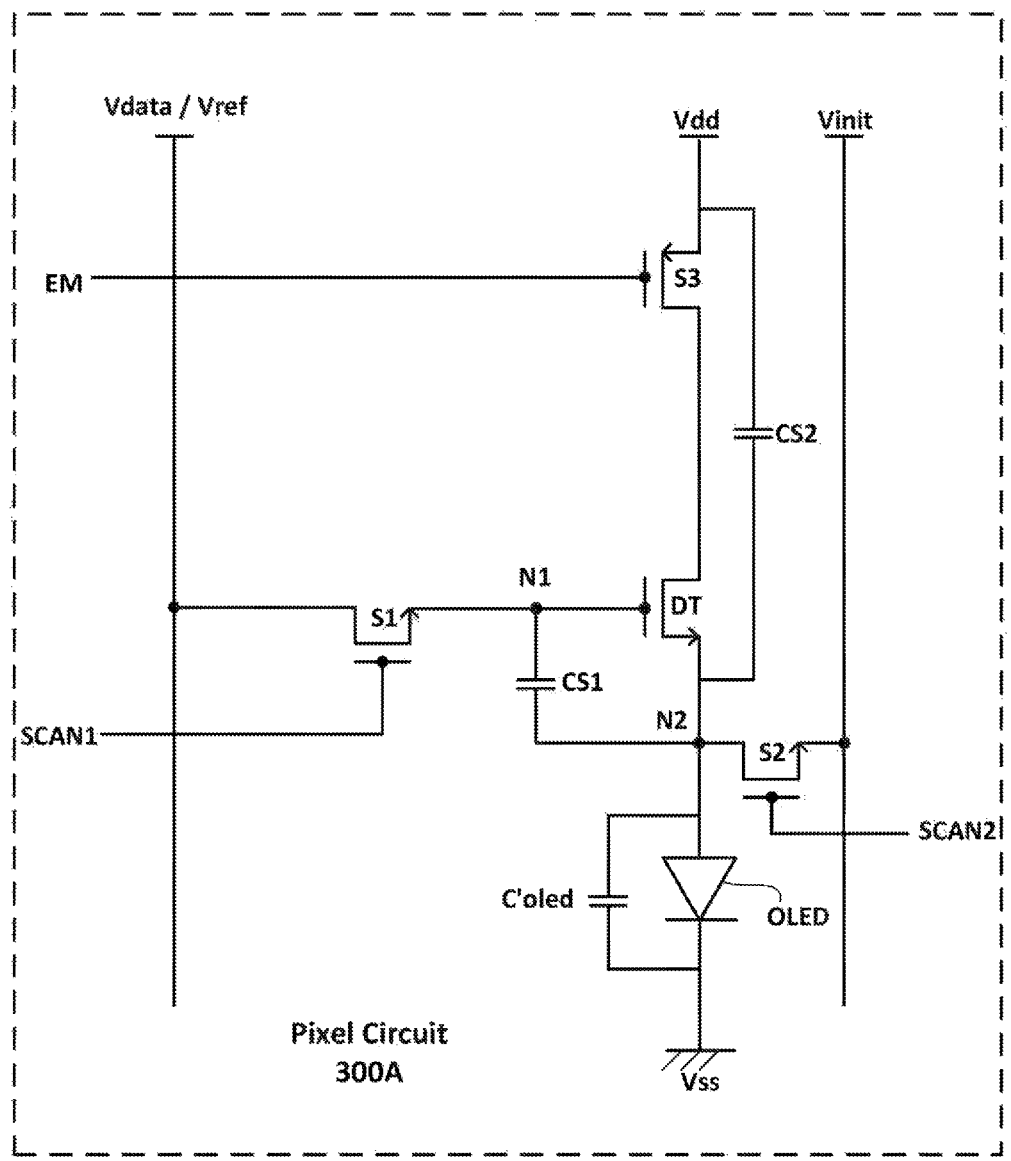
FIGS. 3A, 3B, and 3C are circuit diagrams of each pixel according to other embodiments of the present disclosure, respectively.
Figure 3B:
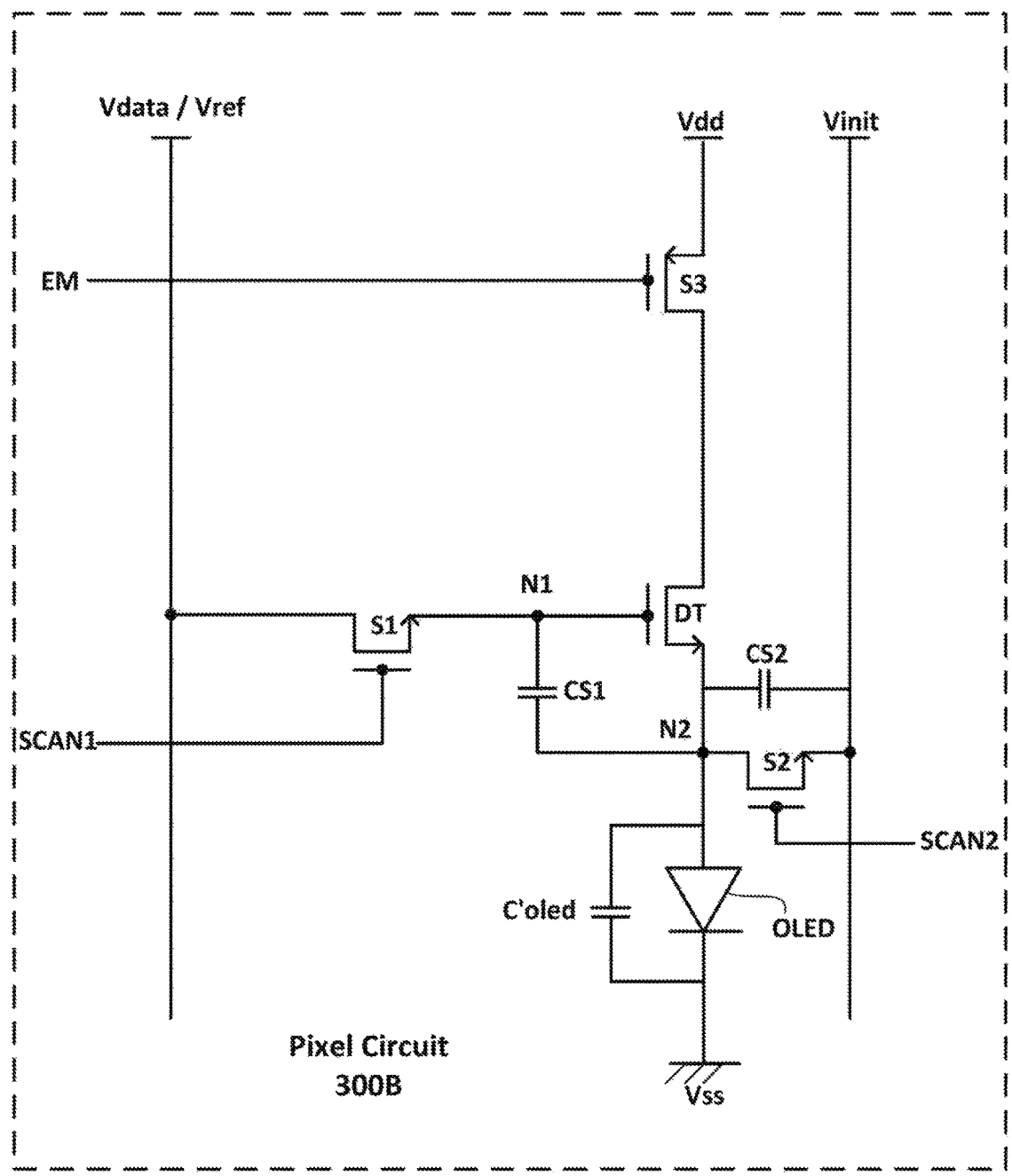
Figure 3C:
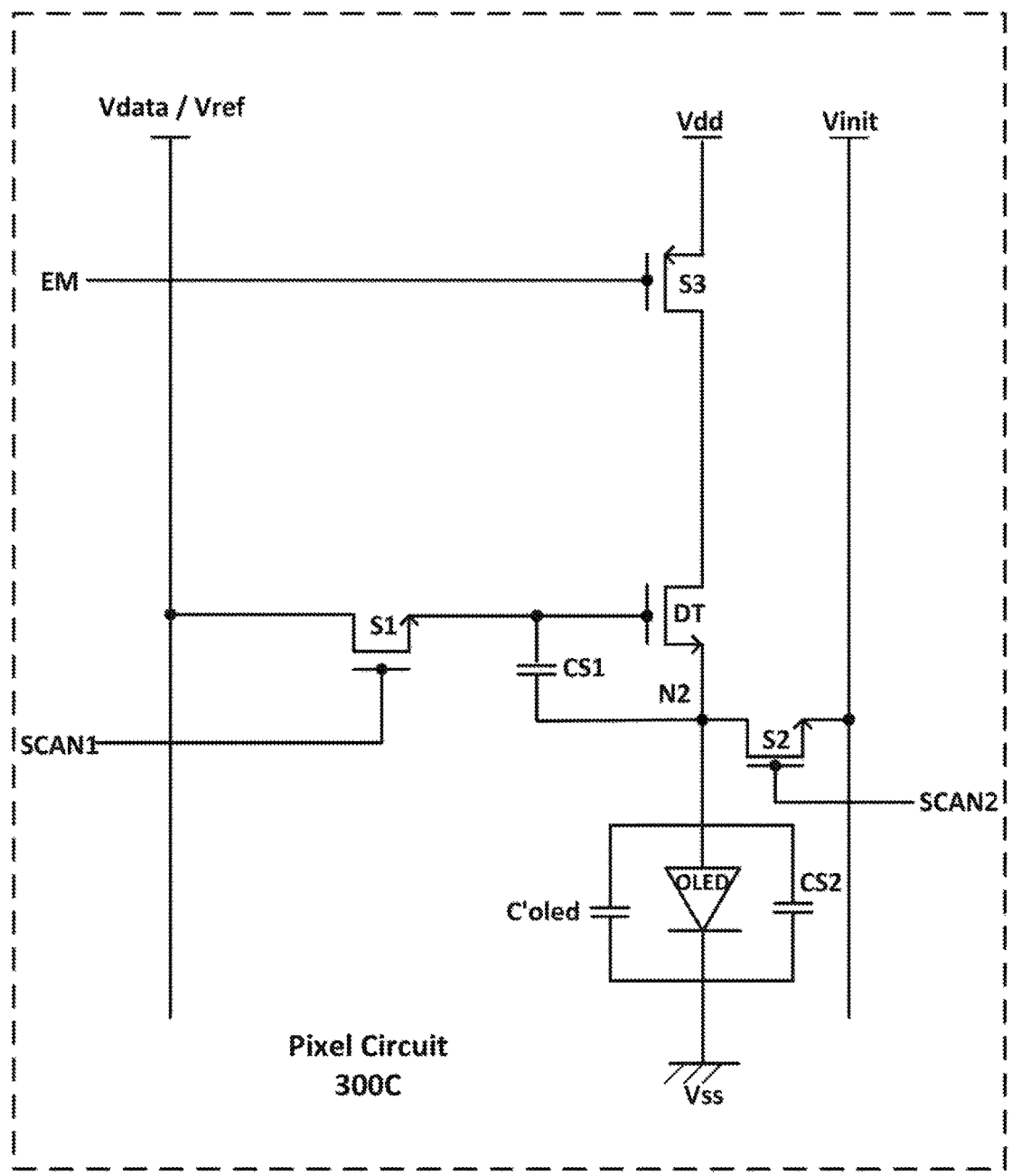
Figure 4A:
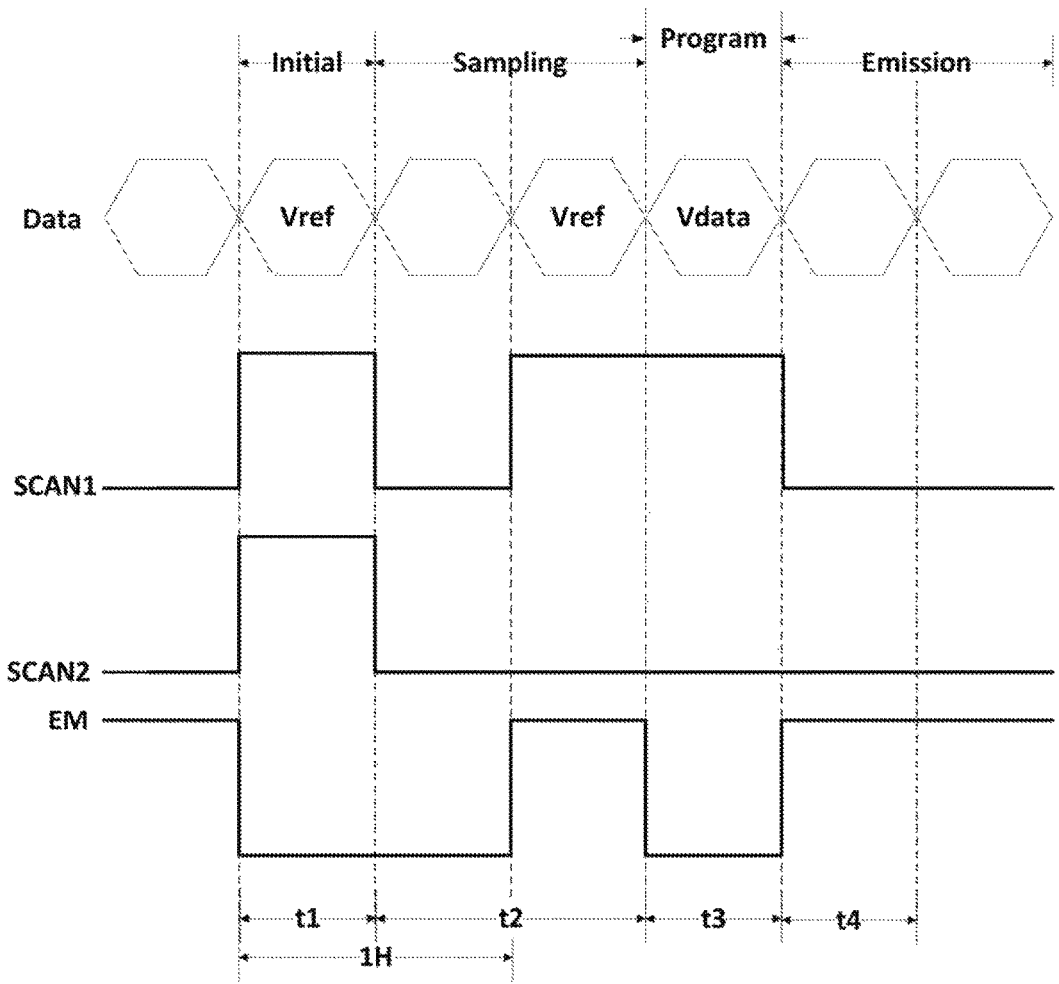
FIG. 4A is a timing diagram illustrating the operation of the pixel circuits of FIGS. 3A-3C.
Figure 4B:
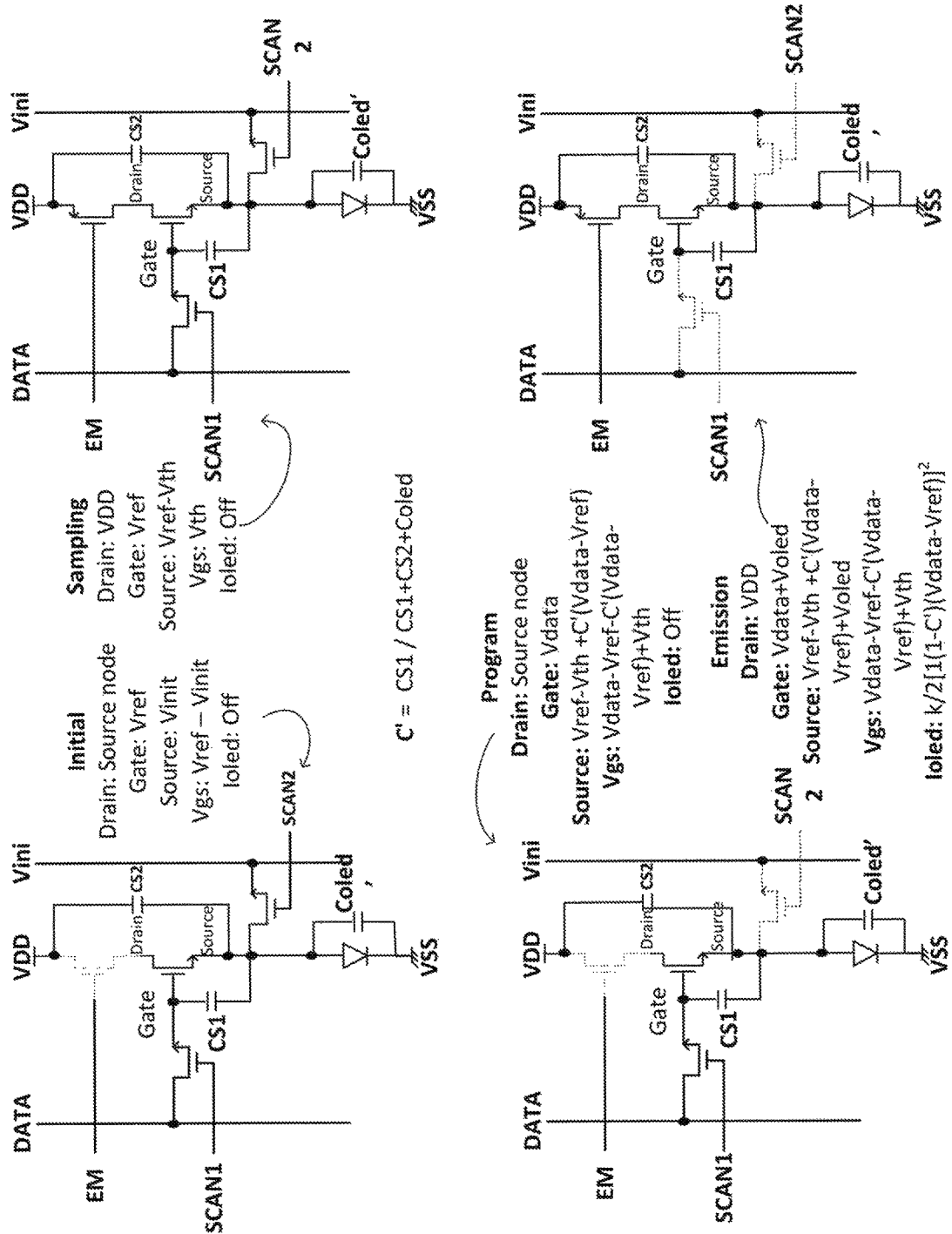
FIG. 4B is a detailed illustration explaining the operation of the pixel circuits of FIGS. 3A-3C.

FIGS. 3A-3C illustrate configuration of an exemplary pixel circuits of an OLED display employing multiple types of TFTs. FIGS. 4A and 4B illustrate an exemplary operation of the pixel circuit of FIG. 3A-3C. In this example, each pixel of a display 100 includes an OLED, and each pixel circuit 300A including a driving TFT DT, first to third switching TFTs S1 to S3, and first and second capacitors CS1 and CS2, respectively. This arrangement may be referred in the present disclosure as a 4T2C pixel circuit.

The exemplary pixel circuit 300A operates in a plurality of periods divided in accordance with a plurality of gate signals supplied to the pixel circuit 300A, namely, an initialization period t1, a sampling period t2, a programming period t3, and an emission period t4.

The first switching TFT S1 is turned on or off based on the state of the first scan signal SCAN1. Turning the first switching TFT S1 on connects the data line DL to the first node N1, which is connected to the gate of the driving TFT DT. High level first scan signal SCAN1 is provided to the first switching TFT S1 during the initialization period t1 and the sampling period t2 to turn on the first switching TFT S1. The first switching TFT S1 is provided with high level first scan signal SCAN1 during the programming period t3 as well. During the initialization period t1 and the sampling period t2, the data line DL supplies the reference voltage Vref, which is provided to the first node N1 via the first switching TFT S1. During the programming period t3, the data line DL provides data voltage Vdata, such that the switching TFT S1 supplies the data voltage Vdata to the first node N1.

The second switching TFT S2 is turned on or off based on the state of the second scan signal SCAN2. During the initialization period t1, the second switching TFT S2 is turned on such that the initialization voltage Vinit is provided to the second node N2, which is connected to a source of the driving TFT DT.

The third switching TFT S3 is turned on or off based on state of the emission signal EM. The third switching TFT S3 may be configured to provide the voltage Vdd from the Vdd supply line to a drain of the driving TFT DT during the sampling period t2 and the emission period t4.

The OLED has one terminal receiving a high potential driving voltage Vdd and another terminal receiving a low potential driving voltage Vss. The OLED emits light by a current flowing between the two terminals. The driving TFT DT is connected in series between the Vdd supply line and the Vss supply line, together with the OLED. The driving TFT DT controls an amount of current flowing in the OLED depending on a voltage difference between a gate and a source of the driving TFT DT. In the emission period t4, the driving TFT DT supplies drive current Ioled to the OLED.

In this exemplary pixel circuit, the first capacitor CS1 is connected between the first node N1 and the second node N2. The first capacitor CS1 stores the threshold voltage (Vth) of the driving TFT DT in the sampling period t2. The second capacitor CS2 is connected between the Vdd supply line and the second node N2. The second capacitor CS2 is connected to the first capacitor CS1 in series, thereby reducing the capacity ratio of the first capacitor CS1. Reducing the capacity ratio of the first capacitor CS1 within the pixel circuit allows more efficient use of the data voltage Vdata applied to the first node N1 during the programming period t3. The second capacitor CS2 enhances the luminance of the OLED with the same data voltage Vdata.

As illustrated in FIG. 3B, the second capacitor CS2 may be connected between the Vinit supply line and the second node N2. Alternatively, the second capacitor CS2 may be connected between the VSS supply line and the second node N2, as illustrated in FIG. 3C. The exemplary operation illustrated in FIGS. 4A-4B can be applied to all of the exemplary pixel circuits shown in FIGS. 3A-3C.

The first and second switching TFTs S1 and S2 are turned on in the initialization period t1. Then, the reference voltage Vref is supplied to the first node N1 via the first switching TFT S1. The initial voltage Vinit is supplied to the second node N2. As a result, the pixel is initialized.

Subsequently, in the sampling period t2, the first and third switching TFTs T1 and T3 are turned on. The first node N1 sustains the reference voltage Vref. In the driving TFT DT, current flows toward the source in a state in which its drain is floated by the high level voltage VDD. When the source voltage of the driving TFT DT is equal to "Vref−Vth", the driving TFT DT is turned off. Here, "Vth" represents the threshold voltage of the driving TFT DT.

In the programming period t3, the first switching TFT S1 is turned on, and the data voltage Vdata is supplied to the first node N1 via the first switching TFT S1. As a result, the voltage of the second node N2 is changed to "Vref−Vth+C' (Vdata−Vref)" due to a coupling phenomenon within the pixel circuit, resulting from the voltage distribution by the in-series connection of the first and second capacitors CS1 and CS2. Here, "C'" represents "CS1/(CS1+CS2+C'oled)". "C'oled" represents the capacitance of the OLED.

In the emission period t4, the third switching TFT S3 is turned on. Then the high level voltage VDD is applied to the drain of the driving TFT DT via the third switching TFT S3. As a result, the driving TFT DT supplies the drive current. In this configuration, the drive current supplied from the driving TFT DT to the OLED can be expressed by the following equation: $\frac{1}{2} \times K$ $(Vdata-Vref-C'(Vdata-Vref))^2$. Here, "K" represents a constant determined in accordance with a mobility of the driving TFT DT and a parasitic capacity of the driving TFT DT.

As it can be recognized from the equation above, the third switching TFT S3 employed in the exemplary pixel circuits of FIG. 3A, FIG. 3B and FIG. 3C suppresses the driving TFT DT to be turned on during the programming period t3 by the voltage Vdd from the Vdd supply line. Further, the pixel circuit employs the capacitor CS1 and the capacitor CS2 to meet the capacitance size that is capable of providing the desired voltage holding ratio (e.g., Voltage Holding Ratio>99%) for the pixel circuit. This configuration can reduce the current leakage from the first switching TFT S1, allowing to sustain the voltage at the gate of the driving TFT DT. The stable voltage at the gate of the driving TFT DT enables more efficient use of the data voltage Vdata during the programming period t3.

As such, the drive current of the OLED is not influenced by the threshold voltage of the driving TFT DT and the high level voltage Vdd. The configuration of the pixel circuit described above compensates Vth differences between the driving TFTs in the pixels as well as the voltage drop of the high level voltage Vdd. Thus, unwanted display non-uniformity is reduced. Further, the mobility deviation of the driving TFT DT can be compensated by adjusting the ascending time of the emission signal EM transitioning from a low state to a high state at a start point of the emission period t4.

While all of the TFTs on the substrate operate jointly to control the emission of light from the OLED, each of the TFTs serves a different function as described above. As such, TFTs implementing a pixel circuit have different operating conditions and requirements amongst each other even within a pixel circuit. Moreover, devices incorporating a display may have various requirements such as minimum visual quality (e.g., luminance, uniformity), power efficiency, higher pixel density, size of the non-display/active areas, and more. Some requirements may be more important than the others depending on the device. Even with the addition of the third switching TFT S3 and the serially distributed capacitors CS1/CS2 in exemplary pixel circuits 300A, 300B and 300C of the present disclosure, meeting more than one of aforementioned requirements can be a difficult task with a TFT backplane employing a single type of TFTs.

For example, a TFT backplane employing oxide TFTs exclusively can provide the minimal leakage current in the pixel circuits FIGS. 3A-3C. However, permanent shift of Vth often occurs in oxide TFTs by the bias stress caused by continuous flow of current for extended period of time. In the operation of exemplary 4T2C pixel circuits described above, the third switching TFT S3, which operates based on the emission signal EM, is in "On" state much longer than other TFTs of the pixel circuit. Under such operation condition, the stability of the third switching TFT S3 can deteriorate in no time.

Therefore, a pixel circuit can be implemented with a combination of LIPS TFTs and oxide TFTs. In one embodiment, an LIPS TFT is used for the third switching TFT S3 while oxide TFTs are used for the other TFTs in the pixel circuit. The third switching TFT S3 made of an LIPS TFT suffers less Vth shift caused by the bias stress during the operation, allowing more stable and accurate control of the third switching TFT S3. With the excellent off current characteristic of oxide TFT, the first switching TFT S1 and the second switching TFT S2 connected to the capacitors CS1 and CS2 can minimize the leakage current in the pixel circuit, thereby furthering the efficiency of the data voltage Vdata in operating the pixel circuits.

EM Switching TFT (PMOS LTPS) for Elimination of Inverter

Figure 5A:
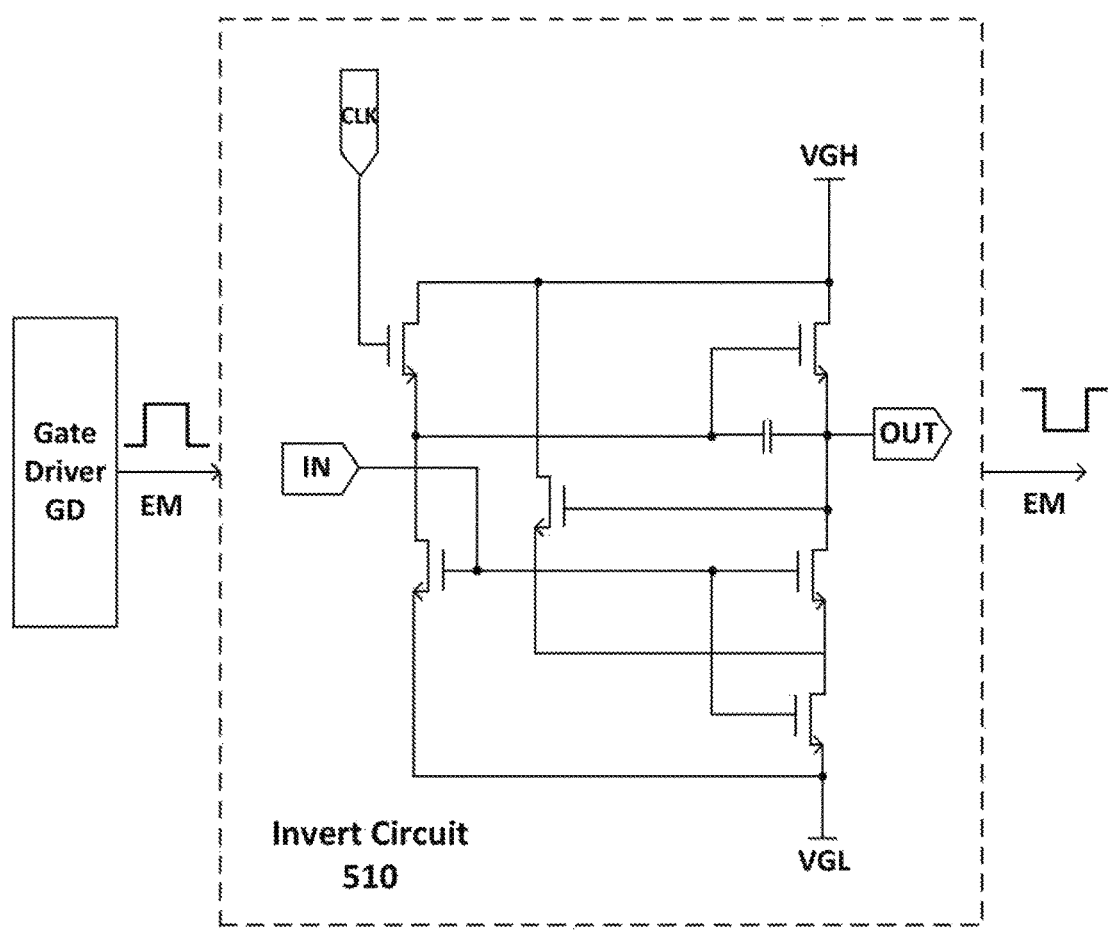
FIG. 5A is a schematic circuit diagram of an exemplary driving circuit.

The third switching TFT S3 can be of an N-Type LIPS TFT or a P-Type LIPS TFT. In case of using N-Type LIPS TFT for the third switching TFT S3, the gate driver GD requires an invert circuit dedicated for providing low voltage emission signal to the third switching TFT S3. FIG. 5A is a schematic diagram illustrating an exemplary invert circuit 510 implemented with six TFTs. As can be seen from FIG. 5A, the number of TFTs in implementing the driving circuits in the non-display area of the TFT backplane 110 can grow quite large. As such, using N-Type LIPS TFT for the third switching TFT S3 may not be the best solution when there is a TFT backplane size requirement. In addition, the needs for a clock signal CLK for driving the invert circuit 510 is yet another constraint which might complicate timing requirements of various other signals in the operation of the display 100. Furthermore, added TFTs and the clock signal would lead to more power consumption.

Figure 5B:
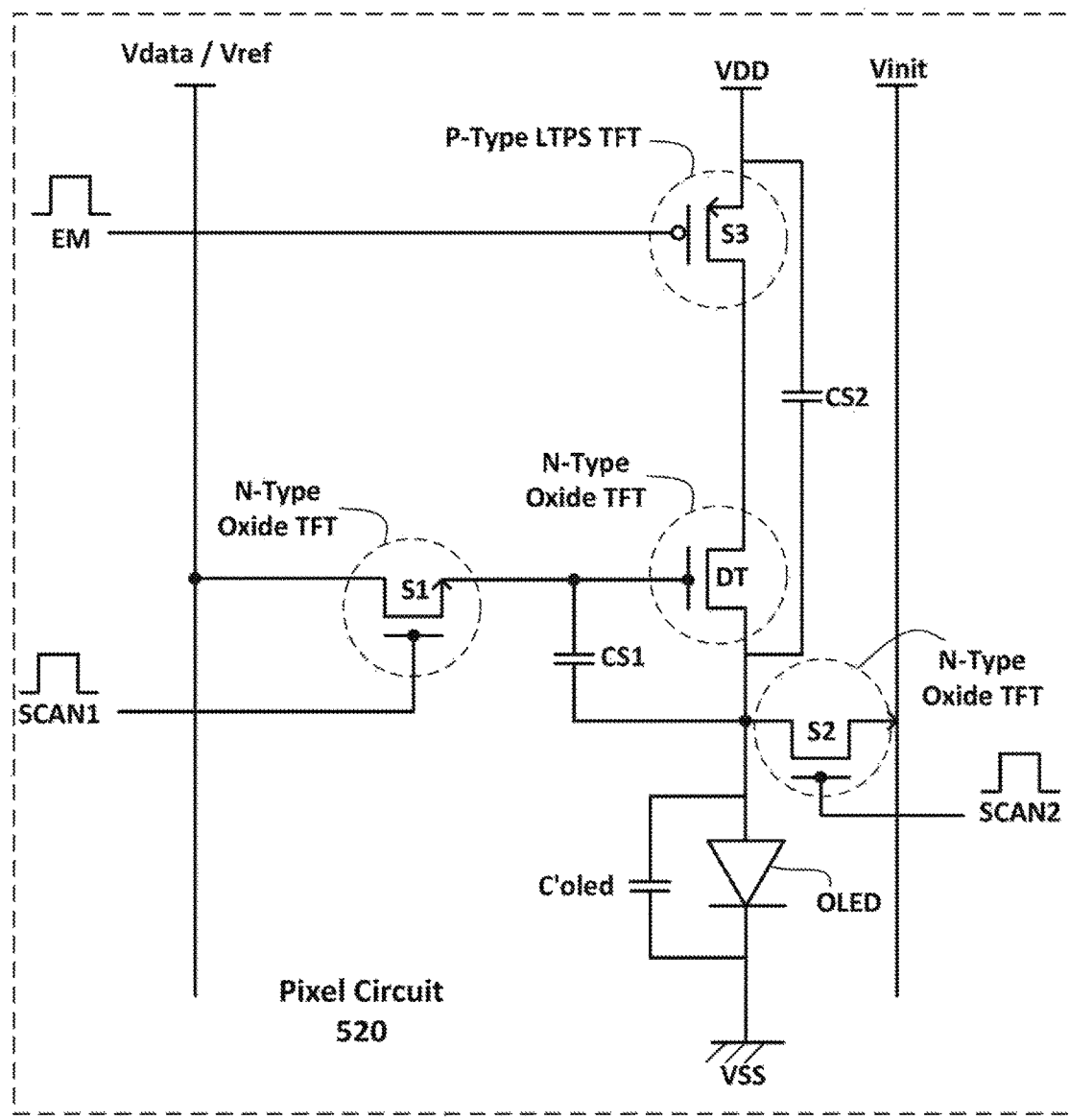
FIG. 5B is a schematic circuit diagram of an exemplary pixel circuit.
Figure 5C:
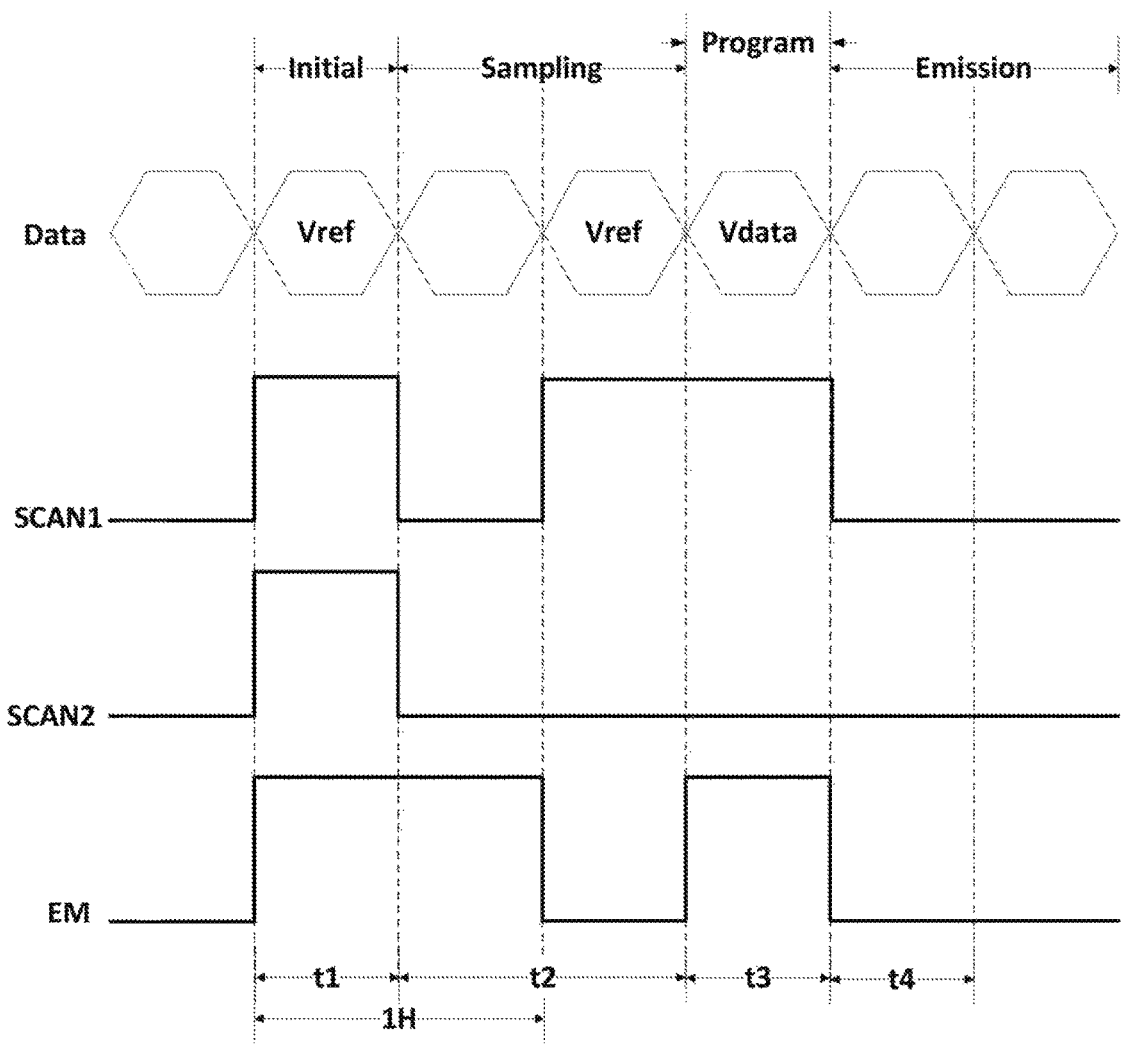
FIG. 5C is a timing diagram illustrating an exemplary operation of the pixel circuit depicted in FIG. 5B.
Figure 5D:
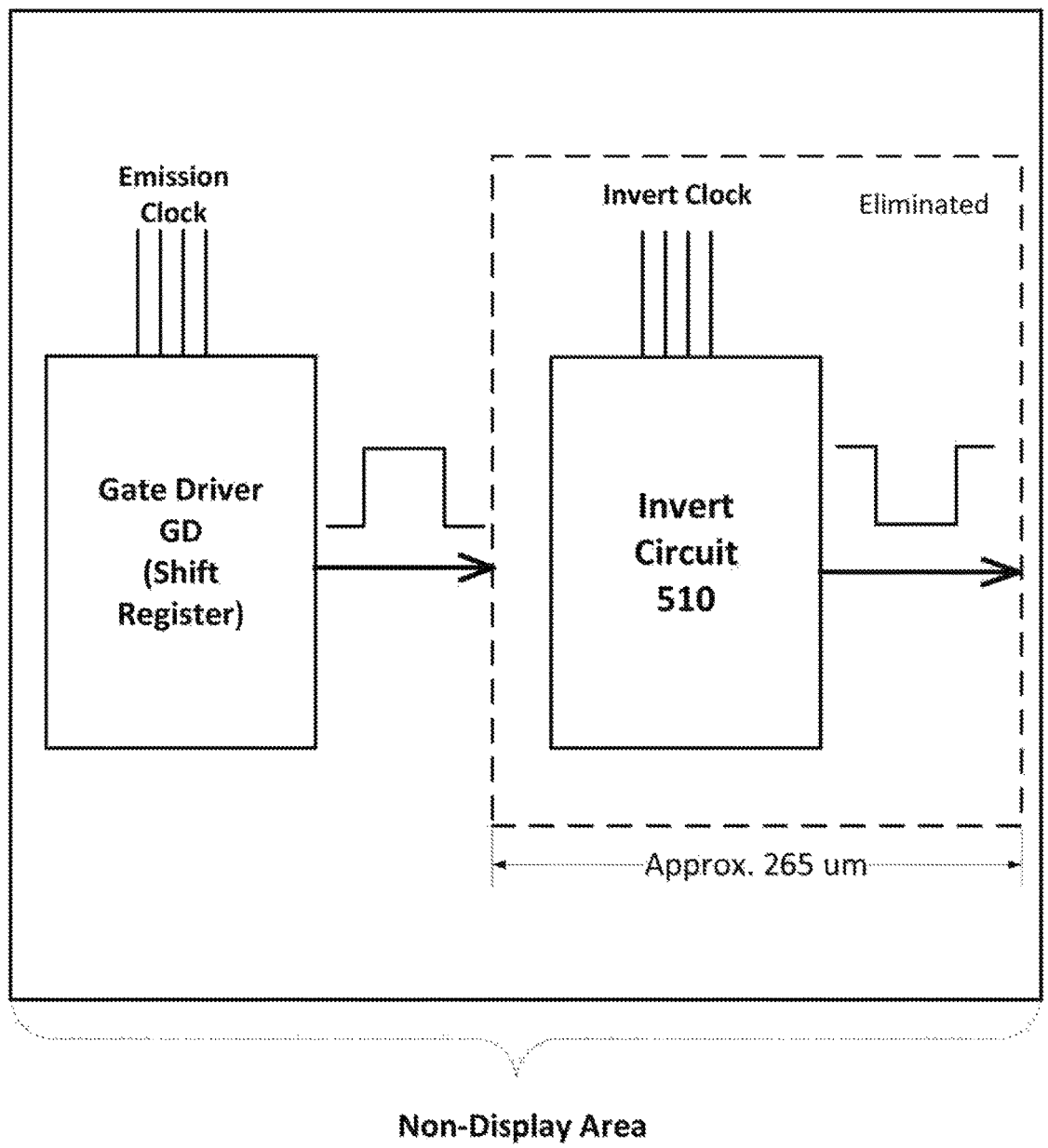
FIG. 5D illustrates eliminating the invert circuit, thereby reducing the size of the driving circuits in the non-display area of the TFT backplane.

Accordingly, in one embodiment, a P-Type LIPS TFT can be used for the third switching TFT S3 while N-Type oxide TFT is used for the first switching TFT S1, the second switching TFT S2 and the driving TFT DT as shown in FIG. 5B. FIG. 5C is a timing diagram of operating the exemplary pixel circuit 520 depicted in FIG. 5B. In this setting, the third switching TFT S3 can be controlled with high level emission signal, and the third switching TFT S3 is configured to provide the voltage Vdd from the Vdd supply line to a drain of the driving TFT DT during the emission period t4 in which the emission signal EM is in a low level state. In other words, there is no need for inverting the emission signal to the gate of the third switching TFT S3. This allows to eliminate the invert circuit 510, thereby reducing the size of the driving circuits in the non-display area of the TFT backplane 110 as illustrated in FIG. 5D. Assuming the invert circuit was implemented with six LTPS TFTs as shown in FIG. 5A, approximately 265 um of the non-display area can be freed by eliminating the invert circuit 510. Elimination of the inverting circuit 510 also means elimination of clock signals, leading to simple and more power efficient driving.

Other Exemplary Use of Oxide TFT and LTPS TFT in a Pixel Circuit

Various other combinational uses of LTPS TFTs and oxide TFTs in a pixel circuit are possible. Similar to the third switching TFT S3, one or more TFTs of a pixel circuit and/or one or more TFTs of a driving circuit (e.g., gate driver GD, multiplexer, etc.) that are more likely to experience bias stress than other TFTs of the respective circuit can be selectively formed of LIPS TFT. Also, switching TFTs that are connected to the capacitors CS1 and/or CS2 can be selectively formed of oxide TFT to reduce the leakage current. For example, the first switching TFT S1 and the second switching TFT S2 may be formed of oxide TFT, while the driving TFT DT and the third switching TFT S3 are formed of LIPS TFT. Further, P-Type LIPS TFT can be used for TFTs within a circuit, which require inverted gate signals for operation.

Figure 6A:
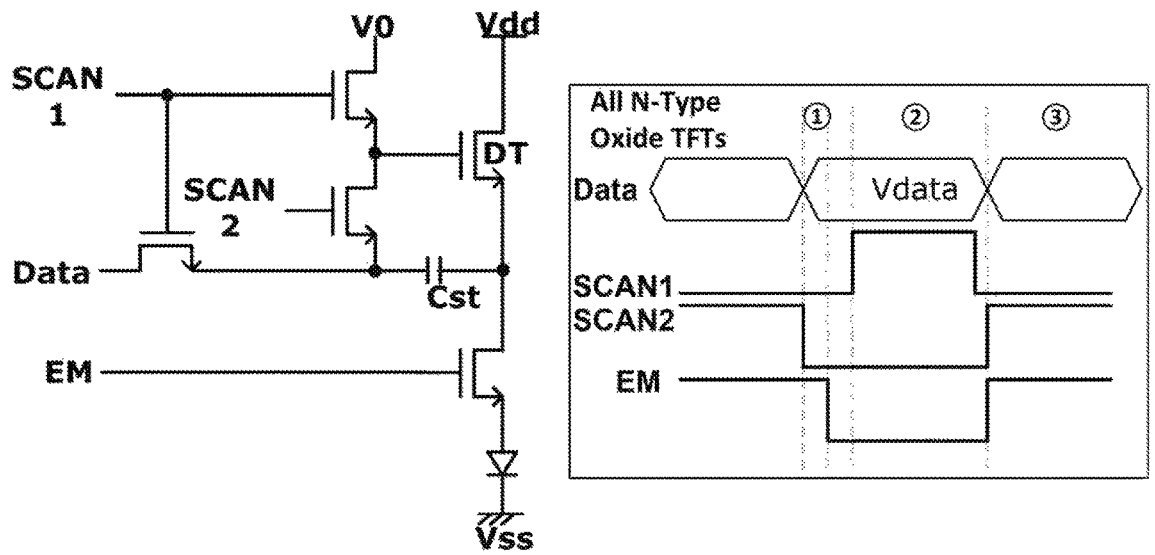
FIGS. 6A and 6B are schematic circuit diagrams of exemplary pixel circuits and timing diagrams illustrating their operation.
Figure 6B:
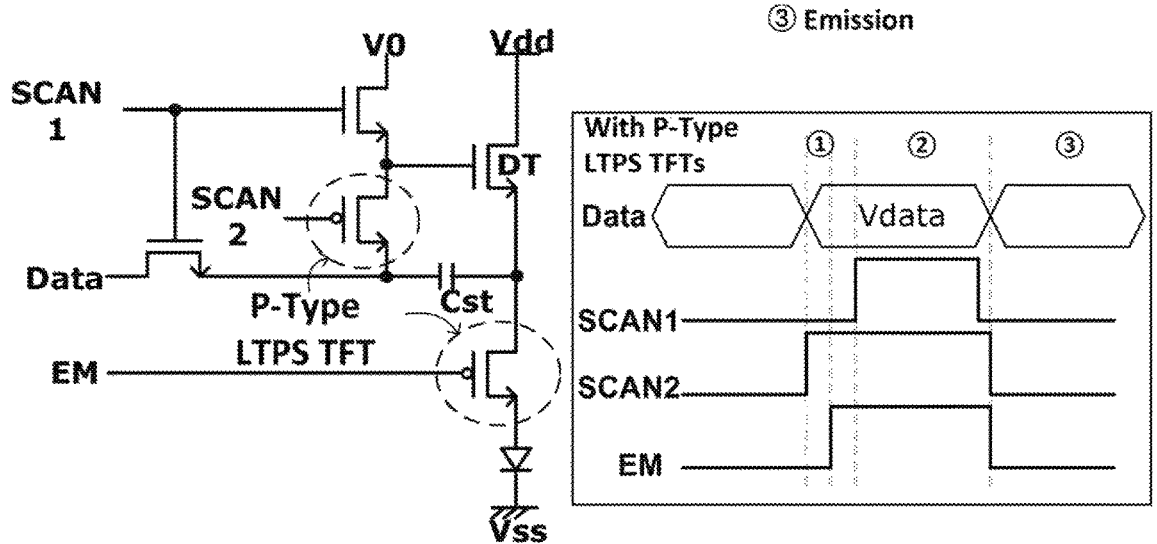

FIGS. 6A and 6B illustrate comparison between exemplary 5T1C pixel circuits, one of which is implemented entirely with N-Type oxide TFTs and another pixel circuit implemented with the combination of N-Type oxide TFTs and P-Type LTPS TFTs. Referring to FIG. 6A, in the pixel circuit implemented entirely with N-Type oxide TFTs, the switching TFTs having their gate electrode connected to the second scan line (SCAN2) and the emission signal line EM are configured to be "On" for most of the time in operating the pixel circuit. As discussed above, these switching TFTs are likely to be affected by the positive bias temperature stress, resulting in permanent Vth shift. These TFTs can be formed with P-Type LTPS TFTs as shown in FIG. 6B, so that they can better withstand against the bias stress during the operation. Many additional advantages, ranging from simpler gate driver GD and driving method, to lower leakage current and power consumption, can be obtained by the combined use of P-Type LTPS TFTs and N-Type oxide TFTs in a 5T1C pixel circuit.

Combination of LPTS TFT and Oxide TFT for Driving TFT

In the examples described above, either an LTPS TFT or an oxide TFT was selectively used for a particular TFT of a circuit. In some embodiments, however, both LTPS TFT and oxide TFT can be used jointly to enhance a functionality of a TFT in a circuit. For instance, the low carrier mobility of the oxide TFT (as compared to LTPS TFT) becomes the bottleneck for achieving high luminance from the OLED when the oxide TFT is used as a driving TFT in a pixel circuit. The low mobility of oxide TFT, on the other hand, makes it convenient to express wide range of gray levels at low luminance level of the OLED. In contrast, higher electron mobility of LTPS TFT makes it easier to achieve higher luminance level when it serves as the driving TFT in a pixel circuit. With higher electron mobility, LIPS TFT is more sensitive to voltage change, and thus precise voltage control is needed to create gray levels at high luminance level.

Accordingly, in one embodiment, a driving TFT in a pixel circuit is implemented with an oxide TFT and an LTPS TFT, which are connected in parallel as illustrated in FIGS. 7A-7C. In FIG. 7A, the current needed by an LTPS based driving TFT DT to express the first gray level and the second gray level are marked with I1 and I2, respectively. The amount of change in data voltage Vdata for expressing the second gray level from the first gray level is marked with ΔV1. The gate of the oxide TFT and the gate of the LTPS TFT are connected to the same gate line. Further, the Vth of the LTPS TFT in this example is configured such that the LTPS TFT is activated in high luminance level (i.e., high Ioled) as shown in FIG. 7B. Accordingly, LTPS TFT is favorably configured to display high gray level. In this configuration, change in the amount of data voltage Vdata necessary for expressing gray level difference at low luminance level (i.e., Low Ioled) becomes larger as illustrated by the FIG. 7C, and this makes it convenient to control the pixel circuit at wide ranges of gray levels at both the low and high luminance levels.

In other words, the oxide TFT and the LIPS TFT used as the driving thin-film transistor and connected in parallel receive a driving voltage simultaneously because they are connected with the same gate line. Accordingly, the OLED device exhibits the characteristic of the oxide TFT in the low luminance range while it exhibits the characteristic of the LIPS TFT in the high luminance range, so that the OLED device can represent the entire tonal range.

Combined Use of P-Type LTPS TFT and N-Type Oxide TFT in a Driving Circuit

Figure 8:
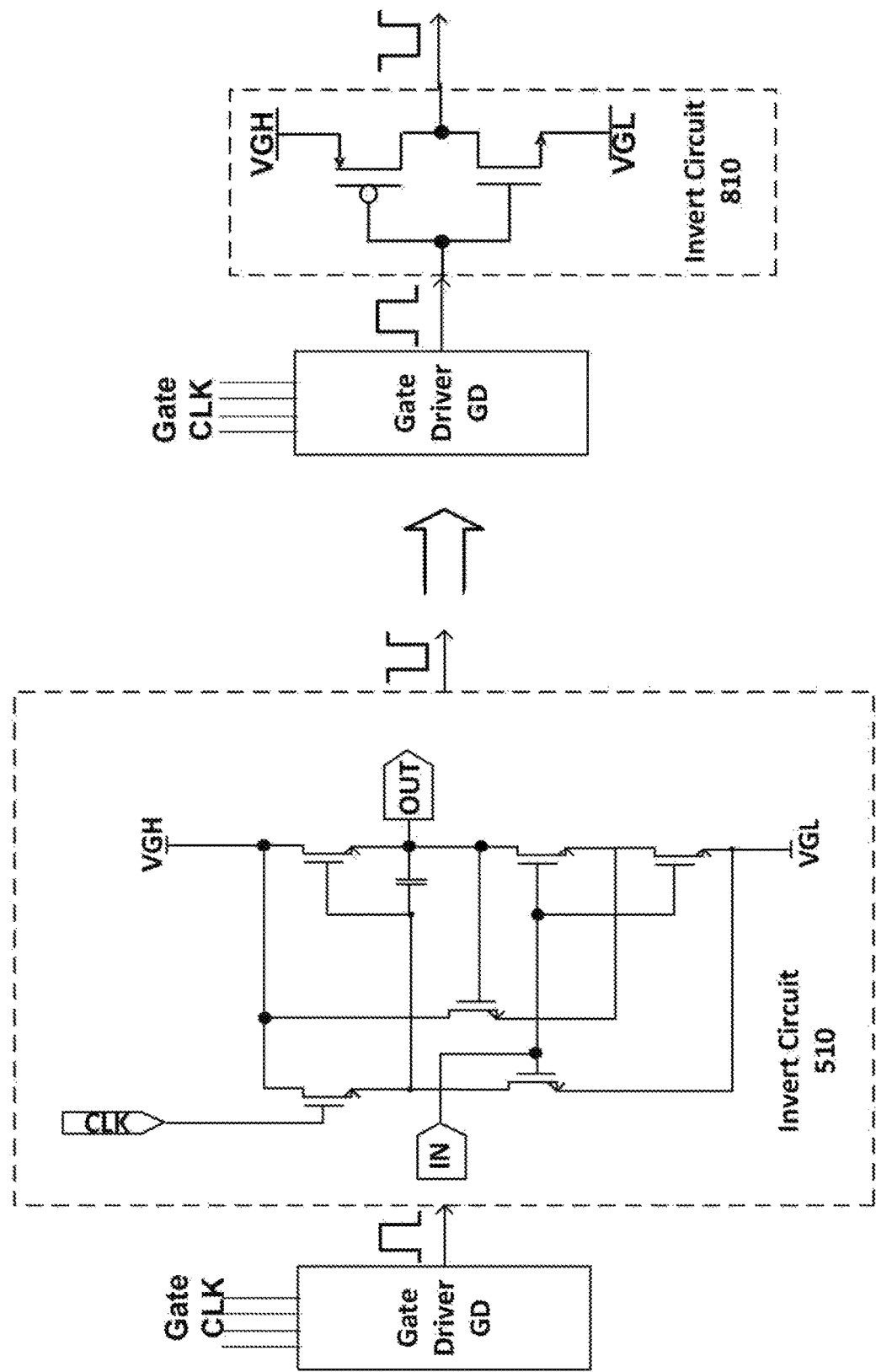
FIG. 8 is a schematic circuit diagram of an exemplary invert circuits.

As mentioned above, driving circuits implemented on the non-display area of the TFT backplane 110 can also be formed of a combination of LIPS TFTs and oxide TFTs. One example where the combination of oxide TFT and LIPS TFT can be used in a driving circuit is an invert circuit (e.g., invert circuit 510). As previously explained, a considerable number of TFTs is required to implement an invert circuit by using only one type of TFTs. Such an invert circuit can be implemented with only two TFTs by using a combination of N-Type oxide TFT and P-Type LIPS TFT as illustrated in FIG. 8.

The simplified invert circuit 810 is particularly useful when an inverted emission signal is used to control an N-Type switching TFT (either N-Type Oxide TFT or N-Type LIPS TFT) of a pixel circuit. With an invert circuit implemented with a combination of P-Type LIPS TFT (W/L=90μ/6.5μ+6.5μ) and an N-Type oxide TFT (W/L=450μ/6.5μ) connected to a gate line (R 14 kΩ, C 30 pF), tR (rise time) of 0.68 μs and tF (fall time) of 2.4881 μs can be expected.

Another example of using a combination of P-Type LIPS TFT and N-Type oxide TFT in a driving circuit implemented the non-display area of a TFT backplane 110 is a multiplexer connected to data driver DD for control of data voltage Vdata. For instance, a multiplexer connected to the data driver DD may be implemented with a plurality of N-Type oxide TFTs and a plurality of P-Type LTPS TFTs, in which a pair of each type of TFTs share a gate line and a data line. The N-Type oxide TFT and the P-Type LTPS TFT will operate alternately based on the level of the signal from the gate line. The data driver DD may be configured to provide appropriate data voltage Vdata through the data line DL according to the timing of the gate line signal so that appropriate TFT of the pair is supplied with the data voltage Vdata. In this configuration, the number of data lines DL can be reduced in half. The number of gate line GL connected to the multiplexer is also reduced in half.

Gate Sharing of Oxide TFT and LTPS TFT

When fabricating an oxide TFT and an LTPS TFT near each other, a bottom gate oxide TFT may be formed above a top gate LTPS TFT such that the gate electrode between the pair of TFTs is shared between the two TFTs. An exemplary configuration of overlapping oxide TFT and LTPS TFT is illustrated in FIG. 9. This structure reduces the size of the multiplexer in the non-display area of the TFT backplane, which can reduce bezel size of the display.

The LTPS TFT 930 of the multi-type TFT 900 includes an active layer 931, a gate electrode 932, a source electrode 933, and a drain electrode 934. Specifically, the active layer 931 of the LTPS TFT 930 is formed on a buffer layer 921 formed on a substrate 91, a first insulation layer 922 is formed on the active layer 931 of the LTPS TFT 930, the gate electrode 930 of the LTPS TFT 930 is formed on the first insulation layer 922, second and third insulation layers 923 and 924 are formed on the gate electrode 932 of the LTPS TFT 930, the source electrode 933 and the drain electrode 934 of the LIPS TFT 930 are in contact with the active layer 931 of the LIPS TFT 930 via respective contact holes formed through the first to third insulation layers of 922 to 924. Accordingly, the LIPS TFT 930 is a coplanar thin-film transistor in which the active layer 931, the gate electrode 932, the source electrode 933 and the drain electrode 934 from the substrate 910, are stacked on one another in this order. The first insulation layer 922 works as a gate insulation layer in the LIPS TFT 930, and the second insulation layer 923 and the third insulation layer 924 work as interlayer insulation layers in the LIPS TFT 930.

The active layer 931 of the LIPS TFT 930 may have a source region in contact with the source electrode 933, a drain region in contact with the drain electrode 934, and a channel region between the source region and the drain region, in which a channel is formed. In the source region and the drain region of the active layer 931, n-type impurity or p-type impurity may be doped, and preferably, the LIPS TFT 930 may be a p-type thin-film transistor.

The oxide TFT 940 of the multi-type TFT 900 includes an active layer 941, a gate electrode 942, a source electrode 943, and a drain electrode 944. Specifically, the gate electrode 942 of the oxide TFT 940 is formed on the first insulation layer 922 formed on the substrate 910, the second insulation layer 923 is formed on the gate electrode 942 of the oxide TFT 940, the active layer 941 of the oxide TFT 940 is formed on the second insulation layer 923, the third insulation layer 924 is formed on the active layer 941 of the oxide TFT 940, the source electrode 943 and the drain electrode 944 of the oxide TFT 940 are in contact with the active layer 941 of the oxide TFT 940 via respective contact holes formed in the third insulation layer 924. Accordingly, the oxide TFT 940 is a bottom-gate thin-film transistor in which the gate electrode 942, the active layer 941, the source electrode 943 and the drain electrode 944 from the substrate 910 are stacked on one another in this order. The oxide TFT 940 may be an n-type thin-film transistor. The second insulation layer 923 works as a gate insulation layer in the oxide TFT 940, and the third insulation layer 924 works as an etch stopper in the oxide TFT 940. Accordingly, there is an advantage in that the second insulation layer 923 works as the interlayer insulation layer in the LTPS TFT 930 while it also works as the gate insulation layer in the oxide TFT 940.

The active layer 941 of the oxide TFT 940 may be made of an oxide semiconductor. The active layer 941 of the oxide TFT 940 may be made of a variety of metal oxide including: quaternary metal oxide such as indium-tin-gallium-zinc-oxide (InSnGaZnO) based material; ternary metal oxide such as indium-gallium-zinc-oxide (InGaZnO) based material, indium-tin-zinc-oxide (InSnZnO) based material, indium-aluminum-zinc-oxide (InAlZnO) based material, indium-hafnium-zinc-oxide (InHfZnO), tin-gallium-zinc-oxide (SnGaZnO) based material, aluminum-gallium-zinc-oxide (AlGaZnO) based material, and tin-aluminum-zinc-oxide based (SnAlZnO) material; binary metal oxide such as indium-zinc-oxide (InZnO) based material, tin-zinc-oxide (SnZnO) based material, aluminum-zinc-oxide (AlZnO) based material, zinc-magnesium-oxide (ZnMgO) based material, tin-magnesium-oxide (SnMgO) based material, indium-magnesium-oxide (InMgO) based material, and indium-gallium-oxide (InGaO) based material; and mono metal oxide such as indium-oxide (InO) based material, tin-oxide (SnO) material, and zinc-oxide (ZnO) based material. The composition ratios among elements contained in the oxide semiconductor materials listed above are not limited to specific values but may be variously selected.

Referring to FIG. 9, the LTPS TFT 930 and the oxide TFT 940 share a gate line. The LTPS TFT 930 and the oxide TFT 940 share the same gate electrode 932 and 942 branching off from the same gate line. Namely, the gate electrode 932 of the LTPS TFT 930 is identical to the gate electrode 942 of the oxide TFT 940. In other words, the gate electrode 932 of the LTPS TFT 930 also works as the gate electrodes 942 of the oxide TFT 940.

The LTPS TFT 930 and the oxide TFT 940 share the source electrodes 933 and 943 and the drain electrodes 934 and 944. Namely, the source electrode 933 of the LTPS TFT 930 is identical to the source electrode 943 of the oxide TFT 940, and the drain electrode 934 of the LTPS TFT 930 is identical to the drain electrode 944 of the oxide TFT 940. Accordingly, the source electrode 933 of the LTPS TFT 930 also works as the source electrode 943 of the oxide TFT 940, and the drain electrode 934 of the LTPS TFT 930 also works as the drain electrode 944 of the oxide TFT 940.

To form two thin-film transistors using the same gate signal, the multi-type TFT 900 has a double-layered structure by stacking vertically the LTPS TFT 930 and the oxide TFT 940 sharing the same gate line. Namely, as shown in FIG. 9, the multi-type TFT 900 has a structure in which the oxide TFT 940 and the LIPS TFT 930 overlap each other, i.e., the oxide TFT 940 is disposed on the LIPS TFT 930. The LIPS TFT 930 and the oxide TFT 940 may share the source electrodes 933 and 943 and the drain electrodes 934 and 944, in addition to the gate electrodes 932 and 942.

Specifically, referring to FIG. 9, the active layer 931 of the LIPS TFT 930 is formed on the buffer layer 921, the first insulation layer 922 is formed on the active layer 931 of the LIPS TFT 930, the gate electrode 932 and 942 of both of the LIPS TFT 930 and the oxide TFT 940 is formed on the first insulation layer 922, the second insulation layer 923 is formed on the gate electrode 932 and 942 of both of the LIPS TFT 930 and the oxide TFT 940, the active layer 931 and 941 of the oxide TFT 940 is formed on the second insulation layer 923, the third insulation layer 924 is formed on the oxide TFT 940, the source electrode 933 and 943 and the drain electrode 934 and 944 of both of the LIPS TFT 930 and the oxide TFT 931 are formed on the third insulation layer 924.

The double-layered structure of the multi-type TFT 900 has the feature that the channel region of the oxide TFT 940 and the channel region of the LIPS TFT 930 overlap each other. Referring to FIG. 9, the active layer 931 of the LIPS TFT 930, the active layer 941 of the oxide thin-film transistor 940, and the gate electrode 932 and 942 of the LIPS TFT 930 and the oxide TFT 940 overlap one another. A channel region of a thin-film transistor is defined as a region in which an active layer and a gate electrode overlap each other. Accordingly, the channel region of the oxide TFT 940 and the channel region of the LIPS TFT 930 overlap each other because the active layer 931 of the LIPS TFT 930 and the active layer 941 of the oxide TFT 940 overlap each other, and the gate electrode 932 and 942 of the LIPS TFT 930 and the oxide TFT 940 are disposed between the active layer 931 of the LIPS TFT 930 and the active layer 941 of the oxide TFT 940. In addition, the length L of the channel region of the oxide TFT 940 may be equal to the length L of the channel region of the LIPS TFT 930, and the area of the channel region of the oxide TFT 940 may be equal to the area of the channel region of the LIPS TFT 930 on a plane.

The multi-type TFT 900 according to the embodiment of the present disclosure has a double-layered structure in which the LIPS TFT 930 and the oxide TFT 940 are stacked on one another, so that the LIPS TFT 930 and the oxide semiconductor 940 share a gate line to thereby minimize an area occupied by the gate line and the gate electrodes 932 and 942 for forming the channel regions of the thin-film transistors.

In the double-layered structure of the multi-type TFT 900 according to the embodiment of the present disclosure, in which the LIPS TFT 930 and the oxide TFT 940 are stacked on one another, the LIPS TFT 930 may be used as a p-type thin-film transistor while the oxide TFT 940 may be used as an n-type thin-film transistor. This could be achieved because once the LIPS TFT 930 is formed as a p-type thin-film transistor by a doping process to dope p-type impurity, the oxide TFT 940 can be formed as an n-type thin-film transistor without an additional doping process.

Consequently, a compact inverter circuit, which is a combination of an n-type thin-film transistor and a p-type thin-film transistor, can be designed advantageously.

Although not shown in FIG. 9, the source electrode 943 of oxide TFT 940 and the source electrode 933 of LIPS TFT 930 may be electrically connected via the same contact hole, and the drain electrode 944 of oxide TFT 940 and the drain electrode 934 of LIPS TFT 930 may be electrically connected via the same contact hole.

In fabrication of TFTs, the active layer of the TFTs are often covered by one or more of passivation layers (e.g., Buffer, GI1, ILD). For instance, an interlayer dielectric (ILD) layer formed of silicon nitride (SiNx) and/or silicon oxide (SiO2) may cover the active layer. Such passivation layers can be used in hydrogenating a poly-silicon semiconductor during fabrication of LIPS TFTs. However, hydrogen ion tends to negatively shift the threshold voltage of an oxide semiconductor. Therefore, oxide TFT 940 is very sensitive to the effect of hydrogen ions at the back channel side, which is particularly important for manufacturing of a display.

For this reason, various configurations can be used to minimize hydrogen ions from reaching the oxide semiconductor layer, especially in the embodiments of the present disclosure where the oxide TFT 940 is formed on the LIPS TFT 930. Accordingly, in some embodiments of the present disclosure, passivation layers with high hydrogen contents may be used under the poly-silicon semiconductor of the LIPS TFT 930, and the gate metal of the LIPS TFT 930 can be configured to shield the at least the channel portion of the oxide semiconductor layer. The passivation layers under the poly-silicon semiconductor layer having high hydrogen contents can be used in hydrogenating the poly-silicon semiconductor layer. Passivation layers on upper side of the poly-silicon semiconductor can be formed of materials with low hydrogen contents, such as SiO2. Here, the low hydrogen content passivation layer, may be formed to have a thickness that is equal to or greater than the thickness of the passivation having high hydrogen content. For instance, for SiNx layer of 2000 angstroms, a SiO2 layer of at least 2000 angstroms may be formed. Further, the shielding metal may be provided connected to Vref or VDD so that the oxide semiconductor is not affected by mobile charge from the layers there under.

In some embodiments, one or more metal oxide layer capable of blocking hydrogen (e.g., Al2O3, TaxOy, other metal oxide) can be formed between the passivation layers with high hydrogen contents and the oxide semiconductor layer. Such hydrogen blocking layers can be formed after the hydrogenation of the poly-silicon semiconductor layer, and the oxide semiconductor layer can be formed after the formation of the hydrogen blocking layer.

Combination of LPTS TFT and Oxide TFT for Driving TFT

Figure 10:
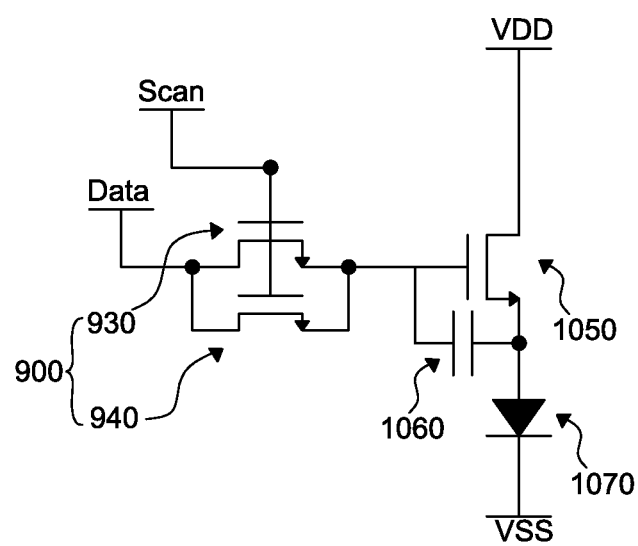
FIG. 10 is a schematic circuit diagram for illustrating an OLED device including a multi-type thin-film transistor according to an embodiment of the present disclosure.

FIG. 10 is a schematic circuit diagram for illustrating an OLED device having the multi-type thin-film transistor according to the embodiment of the present disclosure. Among various circuit structures of the OLED device 1000, FIG. 10 shows a 2T1C structure in which a driving thin-film transistor 1050, thin-film transistors and a storage capacitor 1060 are used, but the circuit structure of the OLED device 1000 is not limited to the 2T1C structure.

The OLED device 1000 according to the embodiment of the present disclosure includes a multi-type TFT 900 formed in a device region (or element region) and an organic light-emitting diode 1070 formed in an emission region. The multi-type TFT 900 is substantially identical to the multi-type TFT 900 shown in FIG. 9 and thus descriptions on the like elements will not be made again.

Referring to FIG. 10, the multi-type TFT 900 works as a switching thin-film transistor 380 of the OLED device 1000. The LTPS TFT 930 and the oxide TFT 940 of the multi-type TFT 900 share the same scan line, i.e., a gate line and receive data voltage from the same data line. The LTPS TFT 930 and the oxide TFT 940 of the multi-type TFT 900 both are electrically connected to the storage capacitor 960 and the driving thin-film transistor 1050.

Another Example for Gate-Sharing of LPTS TFT and Oxide TFT

Figure 11:
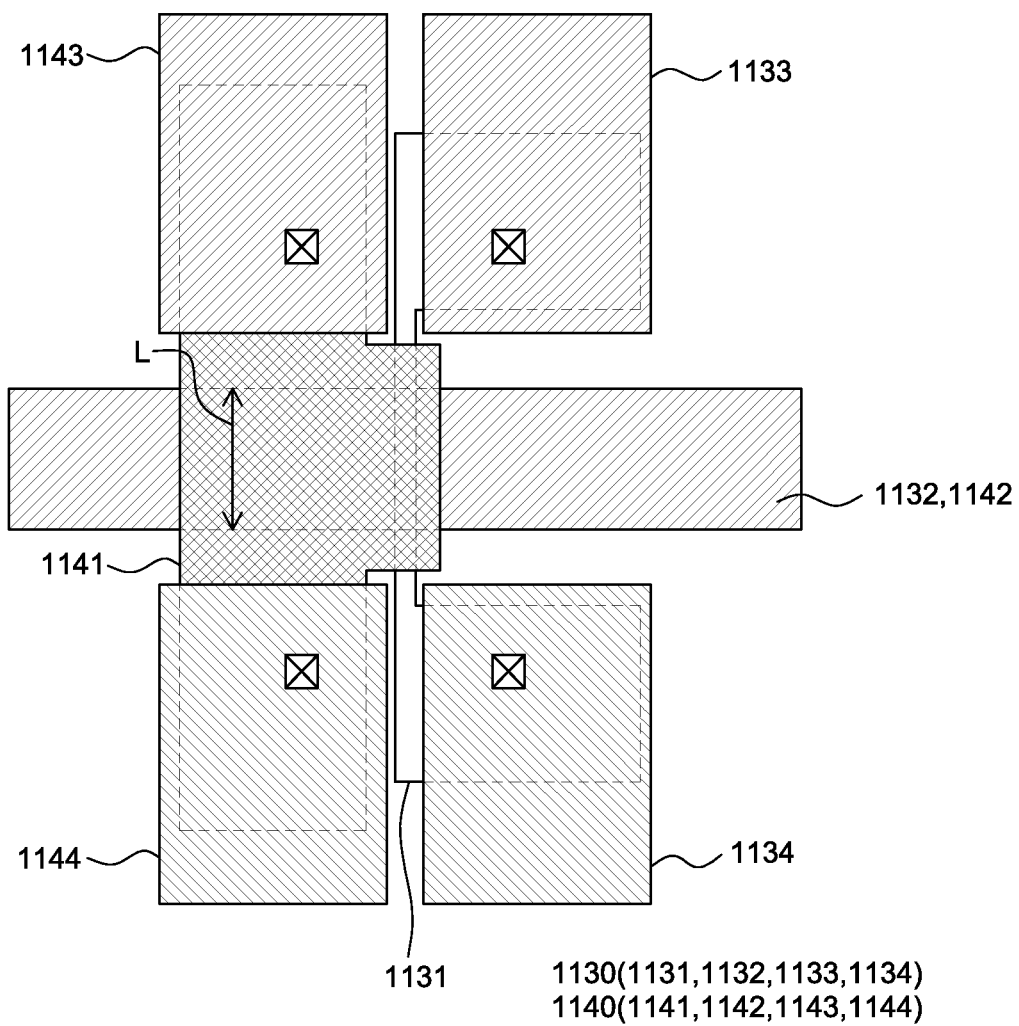
FIG. 11 is a schematic plan view for illustrating a multi-type thin-film transistor according to another embodiment of the present disclosure.

FIG. 11 is a schematic plan view for illustrating a multi-type thin-film transistor according to another embodiment of the present disclosure. Referring to FIG. 11, the multi-type TFT 1100 includes an LTPS TFT 1130 and an oxide TFT 1140. The multi-type TFT 1100 shown in FIG. 11 is substantially identical to the multi-type TFT 900 shown in FIG. 9 except that a source electrode 1133 of the LTPS TFT 1130 is separated from a source electrode 1143 of the oxide TFT 1140, that a drain electrode 1134 of the LTPS TFT 1130 is separated from a drain electrode 1144 of the oxide TFT 1140, and that the shape of active layer 1131 of the LTPS TFT 1130 and the shape of active layer 1141 of the oxide TFT 1140 are different from the corresponding active layers shown in FIG. 2, and thus, descriptions on the like elements will not be made again.

Referring to FIG. 11, the LIPS TFT 1130 and the oxide TFT 1140 share a gate line. The LIPS TFT 1130 and the oxide TFT 1140 share the same gate electrode 1132 and 1142 branching off from the same gate line. Namely, the gate electrode 1132 of the LIPS TFT 1130 is identical to the gate electrode 1142 of the oxide TFT 1140. In other words, the gate electrode 1132 of the LIPS TFT 1130 also works as the gate electrodes 1142 of the oxide TFT 1140.

The source electrode 1133 and the drain electrode 1134 of the LIPS TFT 1130 are electrically separated from the source electrode 1143 and the drain electrode 1144 of the oxide TFT 1140, respectively. Accordingly, the LTPS TFT 1130 and the oxide TFT 1140 of the multi-type TFT 1100 can work as independent thin-film transistors.

Referring to FIG. 11, the multi-type TFT 1100 can form a capacitor by making use of the distance between the active layer 1131 of the LIPS TFT 1130 and the active layer 1141 of the oxide TFT 1140. Accordingly, it is possible to change the capacitance of the OLED device by adjusting the distance between the active layer 1131 of the LIPS TFT 1130 and the active layer 1141 of the oxide TFT 1140, to the extent that the current ratio of Ion to Ioff of the OLED device 1100 is met. Although parasitic capacitance may somewhat occur in the channel regions, such capacitance components can be advantageously used as capacitance necessary for circuit configuration.

Hereinafter, an OLED device employing the multi-type TFT 1100 according to another embodiment of the present disclosure will be described with reference to FIG. 12.

Figure 12:
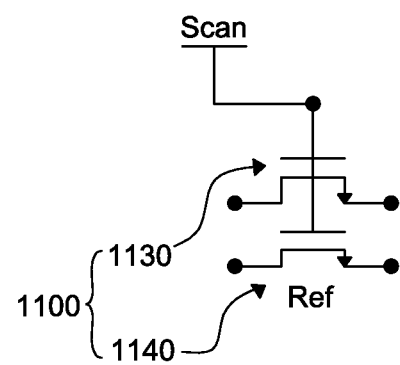
FIG. 12 is a schematic circuit diagram for illustrating an OLED device including a multi-type thin-film transistor according to another embodiment of the present disclosure.

FIG. 12 is a schematic circuit diagram for illustrating an OLED device having the multi-type thin-film transistor according to another embodiment of the present disclosure. FIG. 12 shows only a switching thin-film transistor and a reset thin-film transistor only among a variety of circuit configurations of the OLED device.

Referring to FIG. 12, the LIPS TFT 1130 and the oxide TFT 1140 of the multi-type TFT 1100 share the gate line but they use separate source electrodes 1133 and 1143 and drain electrodes 1134 and 1144, respectively. Accordingly, the LIPS TFT 1130 can work as the switching thin-film transistor while the oxide TFT 1140 can work as the reset thin-film transistor. Therefore, the OLED device according to another embodiment of the present disclosure can improve the aperture ratio of a pixel and can minimize the area of a device region (or element region).

In FIG. 12, the LIPS TFT 1130 works as the switching thin-film transistor while the oxide TFT 1140 works as the reset thin-film transistor, however, the LIPS TFT 1130 may work as the reset thin-film transistor while the oxide TFT 1140 may work as the switching thin-film transistor.

Adjustable Refresh Rate Driving Method

As briefly discussed above, it may be desirable to adjust frame rate of a display based on the image content. Lowering the frame rate for at least some part of the display can result in extra power savings, which is one of the most critical issues for mobile devices. Combined use of oxide TFTs and LIPS TFTs in a TFT backplane can be facilitate such a display.

Figure 13:
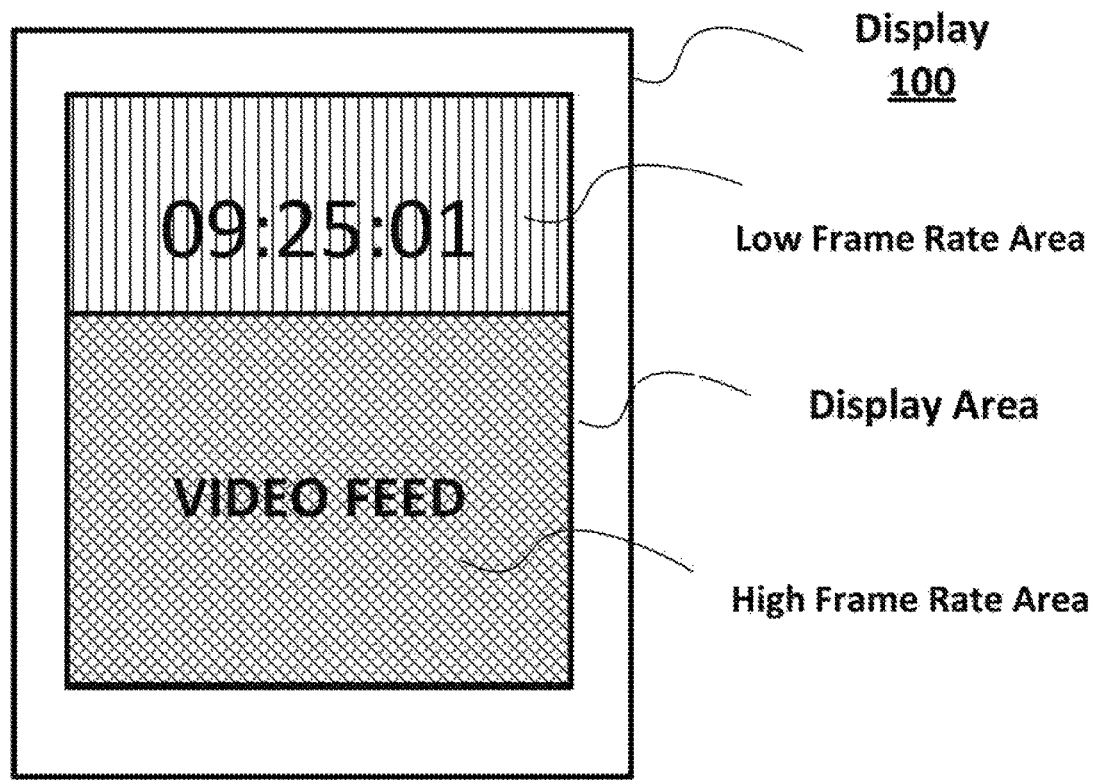
FIG. 13 is an illustration describing an exemplary display mode of the display of the present disclosure.

FIG. 13 illustrates an exemplary screen which can be presented by the display 100, in which a part of the display area is driven with low frame rate. In this example, the display area is divided into two parts; referring to FIG. 13, the low frame rate part that is displaying relatively slow changing image content (e.g., current time) and the fast frame rate part that is displaying relatively fast changing image content (e.g., movie) are shown. In this example, the first part of the display area, which presents the current time to the seconds, may only need to be refreshed at one frame per second.

In a conventional display, however, the driving circuits would output signals (e.g., scan signal, data voltage, emission signal, etc.) sequentially to the pixel circuits in the display area at a predetermined frequency so that the entire display operates at a fixed frame rate (e.g., 60, 120, 240 Hz, etc.). In a display operating at 60 frames per second, signals supplied to the pixel circuits in the first part of the display area for 59 frames may be waste of power, at least in theory.

Data Driver Operation under LRR

Accordingly, in some embodiments, the frequency of signals to the pixel circuits provided from at least one of the driving circuits is controlled depending on the image content to be presented on the display 100. This can be achieved by adding switching circuits to the gate driver GD, to the data driver DD, or to both the gate driver GD and the data driver DD, which is controllable by the low refresh rate LRR signal LRR.

In one embodiment, the data driver DD is configured to receive the low refresh rate signal LRR from the timing controller TC, and to control the refresh rate of an image content. For example, when the image content is a fast changing image contents (e.g., video), the timing controller TC provides the low refresh rate signal LRR in a predetermined state (e.g., low state) to the data driver DD so that the data driver DD processes image data at a preset normal refresh rate. This means that data voltage Vdata are output at a normal refresh rate. In other words, image data for each frame is processed every frame period. In this regard, the data driver DD maintains buffers installed therein in an on state when the data driver DD operates in a normal refresh mode.

On the other hand, the timing controller TC provides the low refresh rate signal LRR of a predetermined state (e.g., high state) to the data driver DD when the image data is a still content (or slow changing image content). In this case, the data driver DD processes the image data at a lower refresh rate than the normal refresh rate. In the low speed refresh mode, image data of one frame is processed for a predetermined frame period only, such that the data voltages Vdata are output at a low refresh rate. To this end, the data driver DD may maintain buffers installed therein in "On" state for the specific frame period only, and maintains the buffers in "Off" state for the remaining frame periods. By turning off of the buffers in the data driver DD, the pixel circuits are updated with new data voltages Vdata only every specific frame period, and this can reduce the power consumption of the display.

Figure 14:
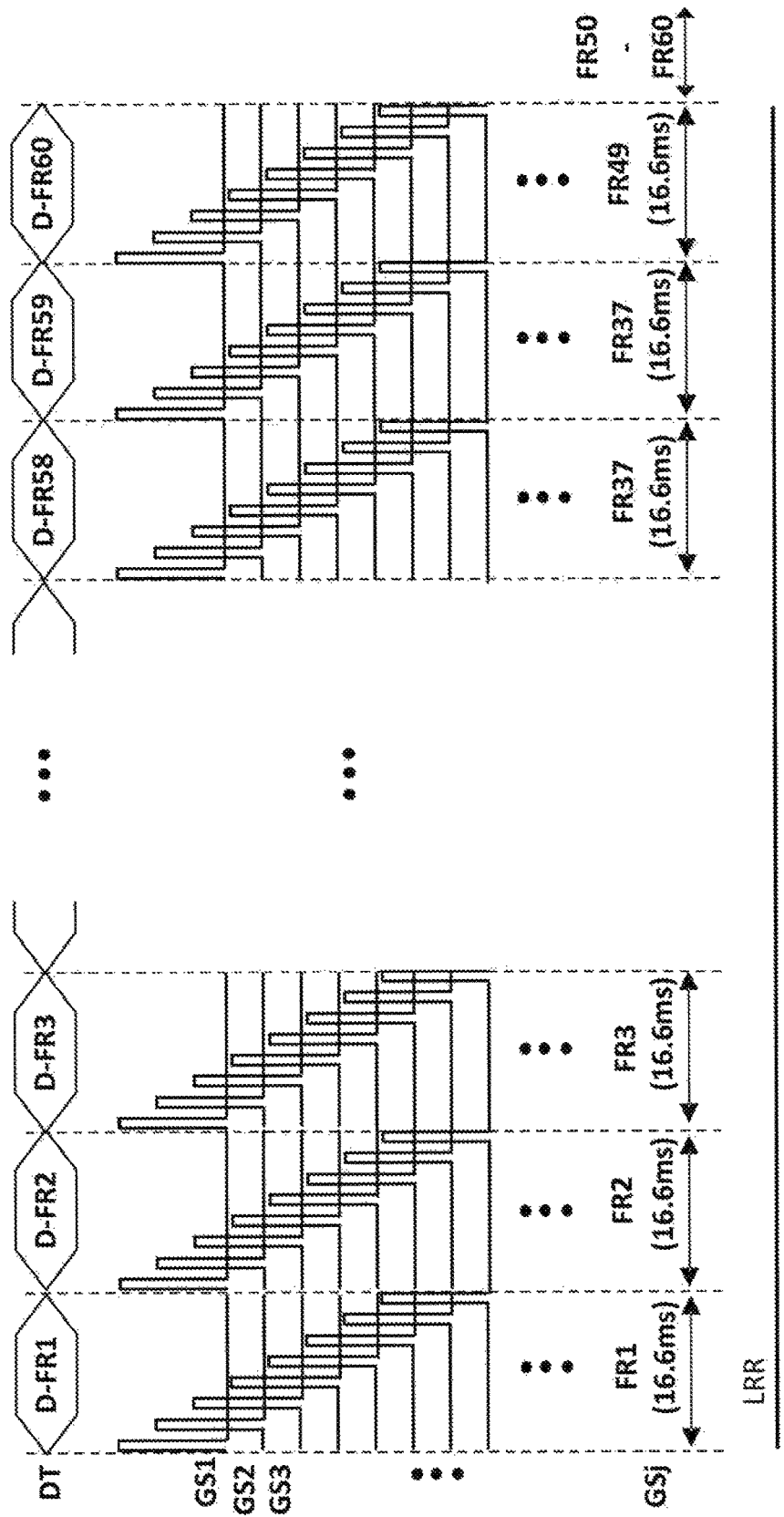
FIG. 14 is a timing diagram illustrating an exemplary operation of the display described in the present disclosure in a normal operation mode.

FIG. 14 is a timing diagram illustrating an exemplary operation of the timing controller TC, the gate driver GD, and the data driver DD in a normal refresh mode. In a normal refresh mode, the low refresh rate signal LRR from the timing controller TC is maintained in a low state so that the switching circuits coupled to the data driver DD are turned on. The gate signals GS1 through GSj are sequentially output by the gate driver GD every frame period and the image data of every frame period FR1 through FR60 is processed by the data driver DD. Assuming that a length of one frame is 16.6 ms, approximately 60 sheets of frames are processed per second, as seen from FIG. 14. That is, the data driver DD performs a refresh operation at 60 Hz.

Figure 15:
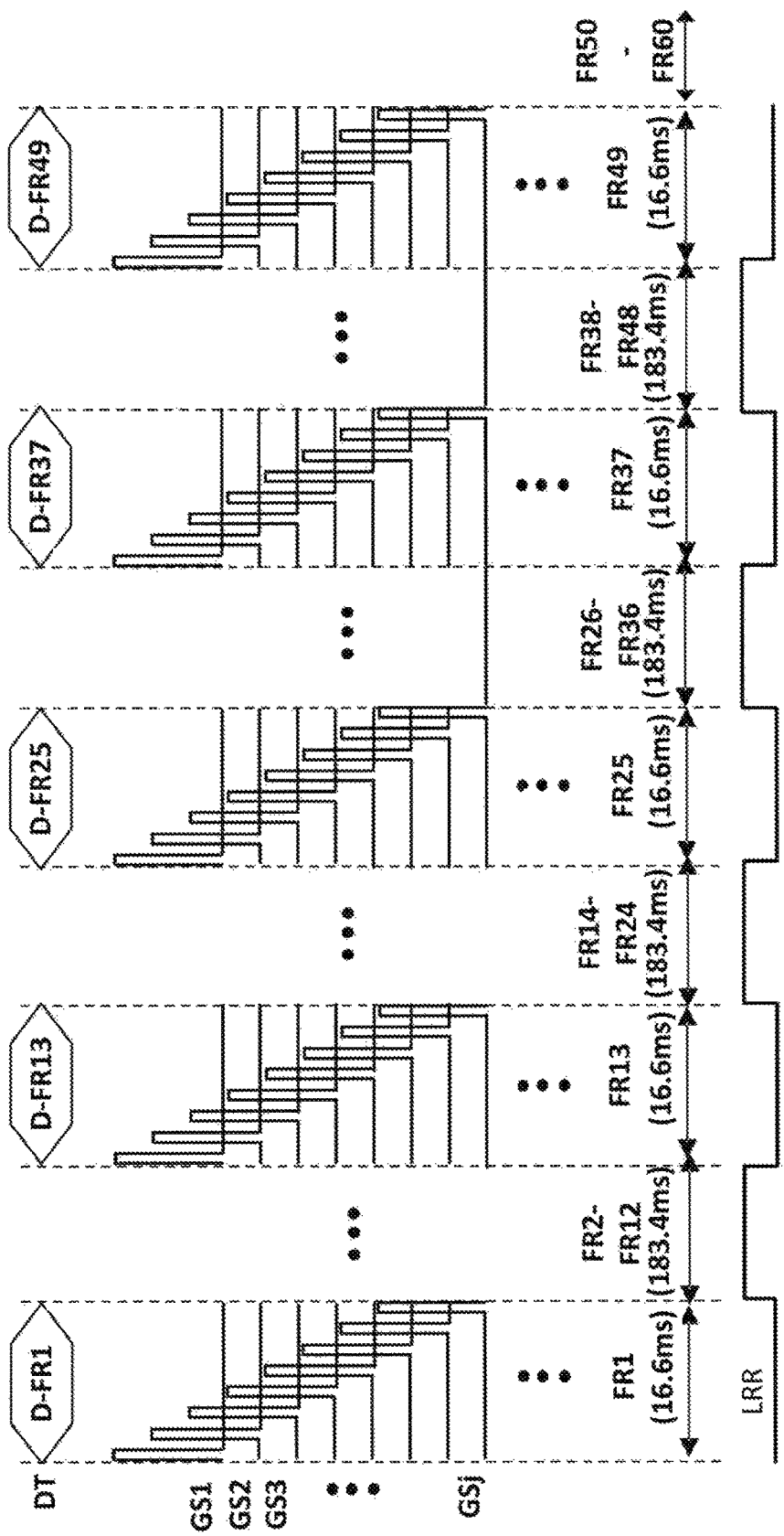
FIG. 15 is a timing diagram illustrating an exemplary operation of the display described in the present disclosure in a low refresh rate mode.

FIG. 15 is a view for explanation of operations of the timing controller TC, the gate driver GD, and the data driver DD in a low speed refresh mode. In the low speed refresh mode, the low refresh rate signal LRR from the timing controller TC is maintained in a low state for specific frame periods FR1, FR13, FR25, FR37, and FR49, and is maintained in a high state for remaining periods FR2-FR12, FR14-FR24, FR26-FR36, FR38-FR48 and FR50-FR60. Accordingly, the switching circuits coupled to the data driver DD are turned off by the low refresh rate signal LRR for 2nd through 12th frame periods FR2 through FR12, 14th through 24th frame periods FR14 through FR24, 26th through 36th frame periods FR26 through FR36, 38th through 48th frame periods FR38 through FR48, and 50th through 60th frame periods FR50 through FR60.

Even if the gate signals GS1 through GSj are sequentially output by the gate driver GD every frame period, only the image data in data frames D-FR1, D-FR13, D-FR25, D-FR37 and D-FR49 are processed during the corresponding frame periods FR1, FR13, FR25, FR37, and FR49 among the 60 frame periods. Assuming that a length of one frame is 16.6 ms, approximately 5 sheets of frames are processed per second, as seen from FIG. 12. That is, the data driver DD performs a refresh operation at 5 Hz.

Referring to FIG. 15, remaining frame periods between two specific adjacent frame periods are set such that time (e.g., 183.4 ms) corresponding to the remaining frame periods between the two specific adjacent frame periods (e.g., FR2-FR12) is greater than time (e.g., 16.6 ms) corresponding to one specific frame period (e.g., FR1) of the two specific adjacent frame periods.

In some embodiments, the low refresh rate signal LRR can be provided to the switching circuits coupled to the data driver DD during a single frame period so that only a part of the display is updated with the new data voltage Vdata. For example, the low refresh rate signal LRR may be provided to the switching circuits coupled to the data driver DD during the period of a frame in which the gate driver DD outputs scan signals on certain gate lines. For instance, the low refresh rate signal LRR can be provided to the switching circuits coupled to the data driver DD when the gate lines 10 through 100 outputs scan signal in selected frames. The pixel circuits connected to the gate lines GL10 through GL100 will not be provided with the new data voltage Vdata from the data driver DD for those selected frames. In this configuration, apart of the display area (e.g., pixels connected to the gate lines GL10 through GL100) can be updated at a frequency different from the remaining part of the display area.

Figure 16:
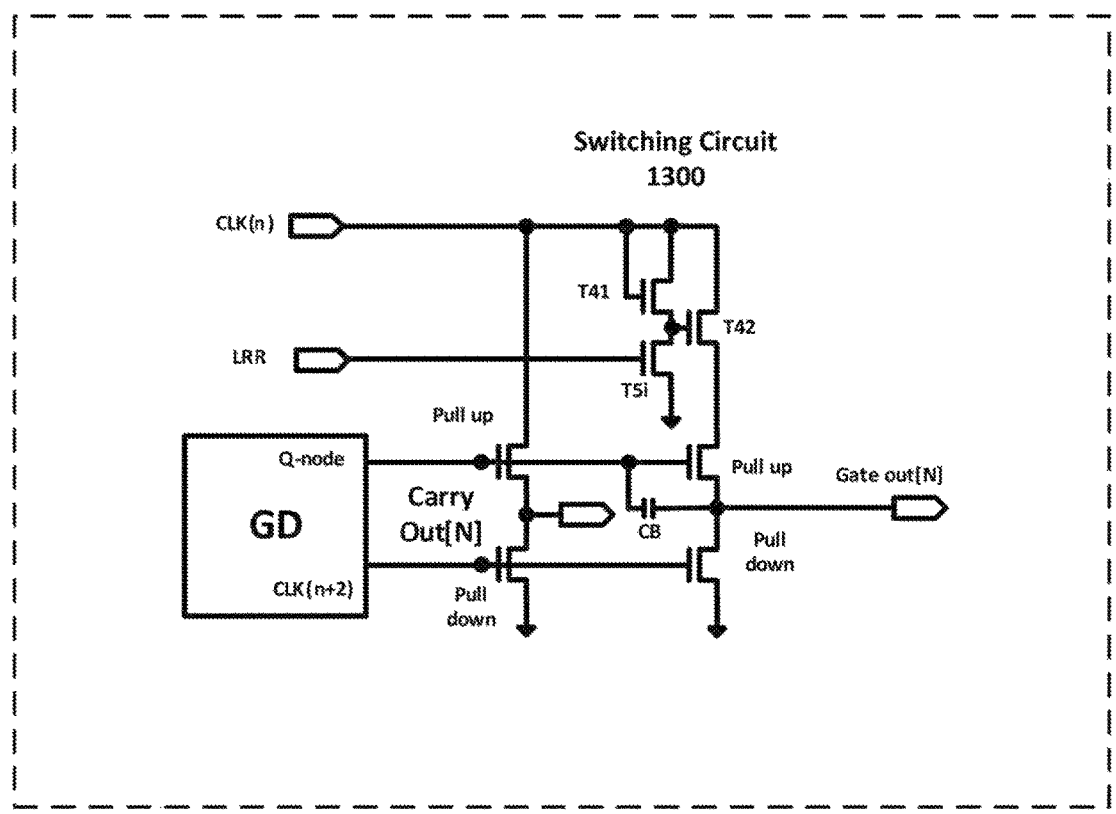
FIG. 16 is a schematic circuit diagram of an exemplary invert circuit.

While running only a part of the display area under the low refresh mode can be done by controlling the switching circuits on the data driver side, it may result in heavy load on the timing controller TC. As such, in one embodiment, the low refresh rate signal LRR is provided to the switching circuits coupled to the gate driver GD. More specifically, the gate driver GD includes a plurality of stages forming a shift register, and can be coupled to each of the stages or some of the stages as shown in FIG. 16.

The switching circuit 1300 is implemented with one or more of TFTs, in which at least one of the TFTs is configured to receive LRR signal for controlling output of a gate signal to the corresponding pixel circuit. When the low refresh rate signal LRR is low, the gate driver GD operates at a preset normal refresh rate. That is, the switching circuits allow the gate signals from the gate driver GD to be provided on all of the gate line [N] in sequence for each of the frames. When the low refresh rate signal LRR is high, however, frequency of the gate signals from the gate driver GD on some or all of the gate lines can be limited.

For operating the entire display area under the low refresh rate mode, the frequency of the gate start pulse signal and/or the frequency of the gate shift clock GSC can be adjusted to reduce the frequency of the pixel circuits of the display to be updated with new data voltage Vdata. To this end, a switch circuit controllable by the low refresh rate LRR signal can be used to hold off the gate start pulse signal for certain frames. Similarly, a switching circuit controllable by the low refresh rate LRR signal can be used to hold off the gate shift clock GSC to create a delay between activation of each shift register. Also, a switching circuit can be configured to control the gate output enable signal GOE for each of the stages based on the low refresh rate LRR signal. For instance, when the low refresh rate signal LRR is high, the gate output enable signal GOE can be set to low so that the pixels are not loaded with the data voltage Vdata.

Regardless of how the switching circuit 1300 is used to implement the low refresh rate mode, the pixel circuits operating under the low refresh rate mode are not loaded with the new data voltage Vdata for one or more frames. The pixels which are not loaded with the data voltage Vdata emits luminance based on the data voltage Vdata that was loaded in the prior frame supplied with the data voltage Vdata.

However, operating the display with the low refresh rate mode described above may not be feasible with a TFT backplane employing a single type of TFTs. For instance, the driving TFT DT within the pixel circuit must maintain the stable driving voltage during the period in which the data is not processed by the data driver DD. Also, the driving voltage may be reduced by a parasitic capacitance while the switching transistor is turned off.

As described above, oxide TFT has excellent voltage holding ratio. However, sensing of the Vth can take significantly longer with an oxide TFT (e.g., as much as 7 times of an LTPS TFT). Also, using oxide TFTs to implement the driving circuit in the non-display area may increase the bezel size. As such, implementing the driving circuit entirely by using the oxide TFT may not provide sufficient driving frequency during the normal refresh mode of the display 100. However, driving the display 100 with the adjustable refresh rate as described in the present disclosure can be realized by using a TFT backplane implemented with multiple types of a combination of oxide TFTs and LIPS TFTs.

In an embodiment, TFTs connected to the storage capacitor is formed of oxide TFT to minimize the leakage current from the capacitor while using LIPS TFT for the driving TFT DT. For instance, the first switching TFT S1 and the second switching TFT S2 can be formed with an LIPS TFT to minimize the leakage current from the storage capacitors C1 and C2. Further, TFTs in the pixel circuit and/or the driving circuit turned on for extended period of time for operating the display 1000 by adjusting the refresh rate can be formed of LIPS TFT. For example, the third switching transistor S3 that is controlled by the emission signal EM can be formed with an LIPS TFT. Also, LIPS TFT can be used for the TFTs that implements the switching circuits coupled to the gate driver GD and/or the data driver DD. In particular, the TFT that is applied with the high state low refresh rate signal LRR can be formed of LIPS TFT (e.g., TFT T5i in the switching circuit 1300).

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims. While the low refresh rate driving mode and the TFT backplane suitable for such a driving mode have been described in the context of OLED display, it should be appreciated that the similar TFT backplane of the embodiments disclosed in the present disclosure can be used for a liquid crystal display (LCD) to implement the low refresh rate mode.

What is claimed is:

1. An organic light emitting display comprising:
   a multi-type thin-film transistor (TFT) having a low-temperature-poly-silicon (LTPS) TFT and an oxide semiconductor TFT (oxide TFT) disposed on the LTPS TFT; and
   an organic light emitting diode electrically connected to the multi-type TFT,
   wherein the LTPS TFT and the oxide TFT are connected to the same gate line,
   a gate electrode of the LTPS TFT is configured to work as a gate electrode of the oxide TFT, and
   a source electrode of the LTPS TFT is configured to work as a source electrode of the oxide TFT, and a drain electrode of the LTPS TFT is configured to work as a drain electrode of the oxide TFT.

2. The organic light emitting display of claim 1, wherein the gate electrode of the LTPS TFT is disposed on an active layer of the LTPS TFT,
   an active layer of the oxide TFT is disposed on the gate electrode of the LTPS TFT, and
   the source electrode and the drain electrode of the LTPS TFT are in contact with the active layer of the LTPS TFT and the active layer of the oxide TFT.

3. The organic light emitting display of claim 1, wherein an active layer of the LTPS TFT overlaps with an active layer of the oxide TFT.

4. The organic light emitting display of claim 3, wherein the oxide TFT and the LTPS TFT are disposed such that a channel region of the oxide TFT and a channel region of the LTPS TFT overlap each other.

5. The organic light emitting display of claim 4, wherein an area of a region where the active layer and a gate electrode of the oxide TFT overlap each other is different from an area of a region where the active layer and a gate electrode of the LTPS TFT overlap each other, and
a length of a region where the active layer and the gate electrode of the oxide TFT overlap each other is different from a length of a region where the active layer and the gate electrode of the LTPS TFT overlap each other.

6. The organic light emitting display of claim 1, wherein the oxide TFT is an n-type TFT, and
the LTPS TFT is a p-type TFT.

7. The organic light emitting display of claim 1, wherein the multi-type TFT is configured to operate as a driving TFT.

8. The organic light emitting display of claim 1, wherein the gate electrode of the LTPS TFT is configured to shield at least a channel region of an active layer of the oxide TFT.

9. The organic light emitting display of claim 1, further comprising a hydrogen blocking layer disposed under an active layer of the oxide TFT in order to block hydrogen.

* * * * *